United States Patent
Blaettler et al.

(10) Patent No.: US 10,797,723 B2
(45) Date of Patent: Oct. 6, 2020

(54) BUILDING A CONTEXT MODEL ENSEMBLE IN A CONTEXT MIXING COMPRESSOR

(71) Applicant: INTERNATIONAL BUSINESS MACHINES CORPORATION, Armonk, NY (US)

(72) Inventors: Tobias Blaettler, Maur (CH); Thomas Mittelholzer, Zurich (CH); Thomas Parnell, Zurich (CH); Charalampos Pozidis, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 292 days.

(21) Appl. No.: 15/458,662

(22) Filed: Mar. 14, 2017

(65) Prior Publication Data
US 2018/0267732 A1 Sep. 20, 2018

(51) Int. Cl.
*G06F 12/00* (2006.01)
*H03M 7/30* (2006.01)
(Continued)

(52) U.S. Cl.
CPC ........... *H03M 7/30* (2013.01); *G06N 3/0454* (2013.01); *G06N 3/08* (2013.01); *H03M 7/6035* (2013.01); *H03M 7/6082* (2013.01)

(58) Field of Classification Search
CPC .... H03M 7/30; H03M 7/6082; H03M 7/6035; G06N 3/02
See application file for complete search history.

(56) References Cited

U.S. PATENT DOCUMENTS

| 6,167,417 A | 12/2000 | Parra et al. |
| 8,351,502 B2 | 1/2013 | Lee et al. |

(Continued)

FOREIGN PATENT DOCUMENTS

| CN | 1774932 A | 5/2006 |
| CN | 102859583 A | 1/2013 |

(Continued)

OTHER PUBLICATIONS

Mahoney, M. V. (2005). Adaptive Weighing of Context models for Lossless Data Compression. Technical Reports of Florida Institute of Technology. Retrieved from: https://repository.lib.fit.edu/handle/11141/154.

(Continued)

*Primary Examiner* — Kalpit Parikh
(74) *Attorney, Agent, or Firm* — Stosch Sabo; Brian F. Russell

(57) ABSTRACT

A technique for selecting context models (CMs) for a CM ensemble (CME) in a context mixing compressor includes measuring compression ratios (CRs) of the compressor on a dataset for each CM included in a base set of CMs. A first CM that has a maximum CR for the dataset is added to the CME. In response to a desired number of the CMs not being in the CME, subsequent CRs for the compressor are measured on the dataset for each of the CMs in the base set of CMs that are not in the CME in conjunction with one or more CMs in the CME. In response to a desired number of the CMs not being in the CME, subsequent CMs that in conjunction with the one or more CMs in the CME result in a maximum subsequent CR for the dataset are added to the CME.

20 Claims, 17 Drawing Sheets

(51) Int. Cl.
*G06N 3/04* (2006.01)
*G06N 3/08* (2006.01)

(56) References Cited

U.S. PATENT DOCUMENTS

| | | | |
|---|---|---|---|
| 8,483,854 | B2 | 7/2013 | Nagaraja et al. |
| 8,499,100 | B1 | 7/2013 | Rothstein |
| 8,533,166 | B1 | 9/2013 | Sulieman et al. |
| 9,172,967 | B2 | 10/2015 | Lou et al. |
| 2009/0021403 | A1* | 1/2009 | Chan ............ H03M 7/30 341/50 |
| 2009/0289819 | A1 | 11/2009 | Mahoney |
| 2011/0090950 | A1 | 4/2011 | Bush et al. |
| 2013/0073798 | A1* | 3/2013 | Kang ............ G06F 12/0246 711/103 |
| 2016/0371190 | A1* | 12/2016 | Romanovskiy ...... G06F 3/067 |

FOREIGN PATENT DOCUMENTS

| | | |
|---|---|---|
| CN | 103546162 | 1/2014 |
| CN | 104320657 | 1/2015 |
| CN | 105721611 A | 6/2016 |
| JP | 5221047 | 6/2013 |

OTHER PUBLICATIONS

Mattern, C. (2011). Combining Non-stationay Prediction, Optimization and Mixing for Data Compression. First International Conference on Data Compression, Communications and Processing, 29-37. doi: 10.1109/CCP.2011.22.

Lin, Y., Lv, F. & Zhu, S. et al. (2011). Large Scale Image Classification: Fast Feature Extraction and SVM Training. IEEE Conference on Computer Vision and Pattern Recognition (CVPR),v1989-1696. doi:10.1109 CVPR.2011.5995477.

Fuchs, G., Subbaraman, V. & Multrus, M. (2011). Efficient Context Adaptive Entropy Coding for Real-Time Applications. IEEE International Conference on Acoustics, Speech and Signal Processing, 493-496. doi: 10.1109/ICASSP.2011.5946448.

Diamantaras, K. I., Homik, K. & Strintzis, M. G. (1999). Optimal Linear Compression Under Unreliable Representation and Robust PCA Neural Models. IEEE Transactions on Neural Networks, 10(5), 1186-1195. doi: 10.1109/72.788657.

International application No. PCT/IB2018/051283, International filing date: Feb. 28, 2018, Search Report and Written Opinion dated Jul. 3, 2018.

Mattern, C. (2012). Mixing Strategies in Data Compression. IEEE Data Compression Conference (DCC) doi.ieeecomputersociety.org/10.1109/DCC.2012.40.

Mahoney, M., "The ZPAQ Compression Algorithm", Dec. 29, 2015.

* cited by examiner

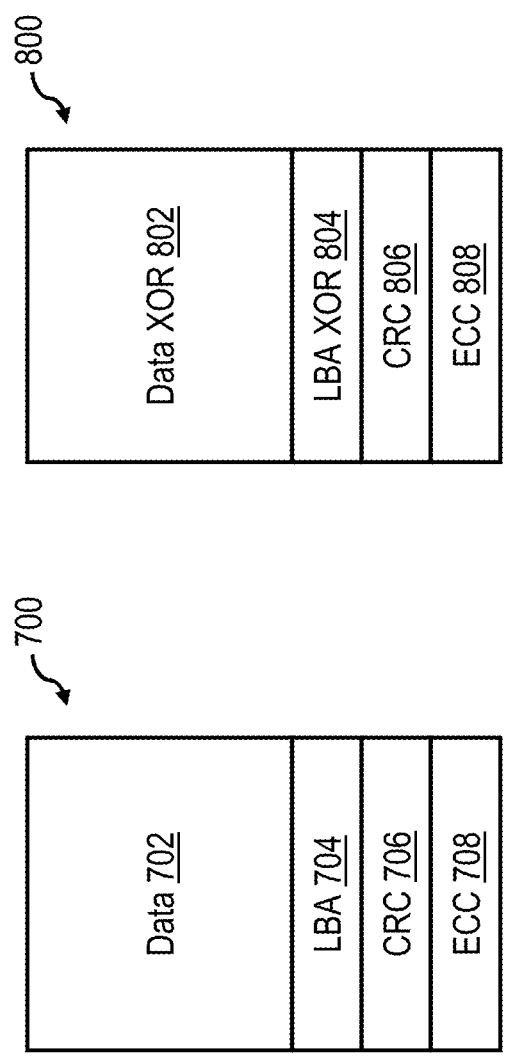

| Emb. | Mixing Function | Weight Notation | # Weights | SGD Weight Update |
|---|---|---|---|---|
| A | $f_\theta(k, x^{(t)}) = \sum_{i=1}^{m}\sum_{k=1}^{K-1} \theta_{i,k}^{(k)} x_{i,k}^{(t)}$ | For $k = 1, 2, \ldots, (K-1)$: $\theta^{(k)} \in \mathbb{R}^{m \times (K-1)}$ | $m(K-1)^2$ | $\theta_{i,k}^{(k)} := \theta_{i,k}^{(k)} + \alpha \left( \delta(y^{(t-1)} = k) - \Pr(y^{(t-1)} = k \mid x^{(t-1)}) \right) x_{i,k}^{(t-1)}$ |
| B | $f_\theta(k, x^{(t)}) = \sum_{i=1}^{m} \theta_i^{(k)} x_{i,k}^{(t)}$ | For $k = 1, 2, \ldots, (K-1)$: $\theta^{(k)} \in \mathbb{R}^{m}$ | $m(K-1)$ | $\theta_i^{(k)} := \theta_i^{(k)} + \alpha \left( \delta(y^{(t-1)} = k) - \Pr(y^{(t-1)} = k \mid x^{(t-1)}) \right) x_{i,k}^{(t-1)}$ |
| C | $f_\theta(k, x^{(t)}) = \sum_{i=1}^{m} \theta_i x_{i,k}^{(t)}$ | $\theta \in \mathbb{R}^{m}$ | $m$ | $\theta_i := \theta_i + \alpha \sum_{k=1}^{K-1} \left( \delta(y^{(t-1)} = k) - \Pr(y^{(t-1)} = k \mid x^{(t-1)}) \right) x_{i,k}^{(t-1)}$ |

BUILDING A CONTEXT MODEL ENSEMBLE IN A CONTEXT MIXING COMPRESSOR

BACKGROUND OF THE INVENTION

This disclosure relates to data processing and storage, and more specifically, to techniques for reducing a size of a context model ensemble in a context mixing compressor/decompressor in a data storage system, such as a flash memory system.

NAND flash memory is an electrically programmable and erasable non-volatile memory technology that stores one or more bits of data per memory cell as a charge on the floating gate of a transistor or a similar charge trap structure. In a typical implementation, a NAND flash memory array is organized in blocks (also referred to as "erase blocks") of physical memory, each of which includes multiple physical pages each in turn containing a multiplicity of memory cells. By virtue of the arrangement of the word and bit lines utilized to access memory cells, flash memory arrays can generally be programmed on a page basis, but are erased on a block basis.

As is known in the art, blocks of NAND flash memory must be erased prior to being programmed with new data. A block of NAND flash memory cells is erased by applying a high positive erase voltage pulse to the p-well bulk area of the selected block and by biasing to ground all of the word lines of the memory cells to be erased. Application of the erase pulse promotes tunneling of electrons off of the floating gates of the memory cells biased to ground to give them a net positive charge and thus transition the voltage thresholds of the memory cells toward the erased state. Each erase pulse is generally followed by an erase verify operation that reads the erase block to determine whether the erase operation was successful, for example, by verifying that less than a threshold number of memory cells in the erase block have been unsuccessfully erased. In general, erase pulses continue to be applied to the erase block until the erase verify operation succeeds or until a predetermined number of erase pulses have been used (i.e., the erase pulse budget is exhausted).

A NAND flash memory cell can be programmed by applying a positive high program voltage to the word line of the memory cell to be programmed and by applying an intermediate pass voltage to the memory cells in the same string in which programming is to be inhibited. Application of the program voltage causes tunneling of electrons onto the floating gate to change its state from an initial erased state to a programmed state having a net negative charge. Following programming, the programmed page is typically read in a read verify operation to ensure that the program operation was successful, for example, by verifying that less than a threshold number of memory cells in the programmed page contain bit errors. In general, program and read verify operations are applied to the page until the read verify operation succeeds or until a predetermined number of programming pulses have been used (i.e., the program pulse budget is exhausted).

PAQ provides a series of lossless data compression archivers that have, through collaborative development, topped rankings on several benchmarks measuring compression ratio (CR). In general, various PAQ versions have implemented a context mixing algorithm. Context mixing is related to prediction by partial matching (PPM) in that the compressor/decompressor is divided into a predictor and an arithmetic encoder/decoder, but differs in that the next-symbol prediction is computed using a weighed combination of probability estimates from a large number of models conditioned on different contexts. Unlike PPM, a context in PAQ does not need to be contiguous.

In general, all PAQ versions, while differing in the details of the models and how the predictions are combined and post-processed, predict and compress one bit at a time. When the next-bit probability is determined, the next-bit is encoded by arithmetic coding. In PAQ1 through PAQ3, each prediction is represented as a pair of bit counts that are combined by weighted summation, with greater weights given to longer contexts. In PAQ4 through PAQ6, the predictions are combined (as in PAQ1 through PAQ3), however, weights assigned to each model are adjusted to favor more accurate models. In PAQ7 and later PAQ versions, each model outputs a probability (rather than a pair of counts) with the model probabilities being combined using a neural network mixer.

Unfortunately, while context mixing compression algorithms top almost all known compression benchmarks, due to the large number of context models implemented, the complexity of neural computation, and their binary nature, context mixing compression algorithms tend to be very slow (for example, the PAQ81 algorithm has a bandwidth around 20 kB/s).

BRIEF SUMMARY

The disclosed techniques advantageously improve the implementation of context mixing compression/decompression algorithms in data storage systems.

A technique for selecting context models (CMs) for a CM ensemble (CME) in a context mixing compressor includes measuring compression ratios (CRs) of the compressor on a dataset for each CM included in a base set of CMs. A first CM that has a maximum CR for the dataset is added to the CME. In response to a desired number of the CMs not being in the CME, subsequent CRs for the compressor are measured on the dataset for each of the CMs in the base set of CMs that are not in the CME in conjunction with one or more CMs in the CME. In response to a desired number of the CMs not being in the CME, subsequent CMs that in conjunction with the one or more CMs in the CME result in a maximum subsequent CR for the dataset are added to the CME.

According to another embodiment, the context mixing compressor is a non-binary context mixing compressor.

According to yet another embodiment, the context mixing compressor is a binary context mixing compressor.

According to a different embodiment, the desired number of the context models is determined based on achieving a desired minimum CR.

According to yet another embodiment, the desired number of the context models is determined based on achieving a desired minimum throughput.

In another embodiment, the desired number of the context models is determined based on achieving a desired minimum CR and desired minimum throughput.

In yet another embodiment, the dataset is associated with a customer workload.

The disclosed techniques may be implemented as a method, a data storage system, and/or a program product (including program code stored in a storage device).

BRIEF DESCRIPTION OF THE SEVERAL VIEWS OF THE DRAWINGS

FIG. 7 illustrates an exemplary codeword stored in each data page in accordance with the present disclosure;

FIG. 8 depicts an exemplary codeword stored in each data protection page in accordance with the present disclosure;

FIG. 15 depicts a table that includes respective formulas for three different exemplary mixers (i.e., embodiments 'A', 'B', and 'C') configured according to the present disclosure;

DETAILED DESCRIPTION

According to one or more embodiments of the present disclosure, a non-binary context mixing compressor/decompressor architecture is disclosed that includes an ensemble of context models that produce symbol predictions that are distributed as inputs to a maximum entropy model or a neural network that performs mixing of the symbol predictions to generate a learned prediction. According to one or more other embodiments of the present disclosure, the architecture is coupled with techniques for context model selection that learn the best ensemble of context models (to provide inputs to a maximum entropy model or a neural network mixer) for a particular customer workload. The disclosed compression techniques may be implemented inline (e.g., using field programmable gate array (FPGA) acceleration) or in the background (e.g., by software). The disclosed techniques are broadly applicable to context modeling with neural network mixing.

Figure 1A:
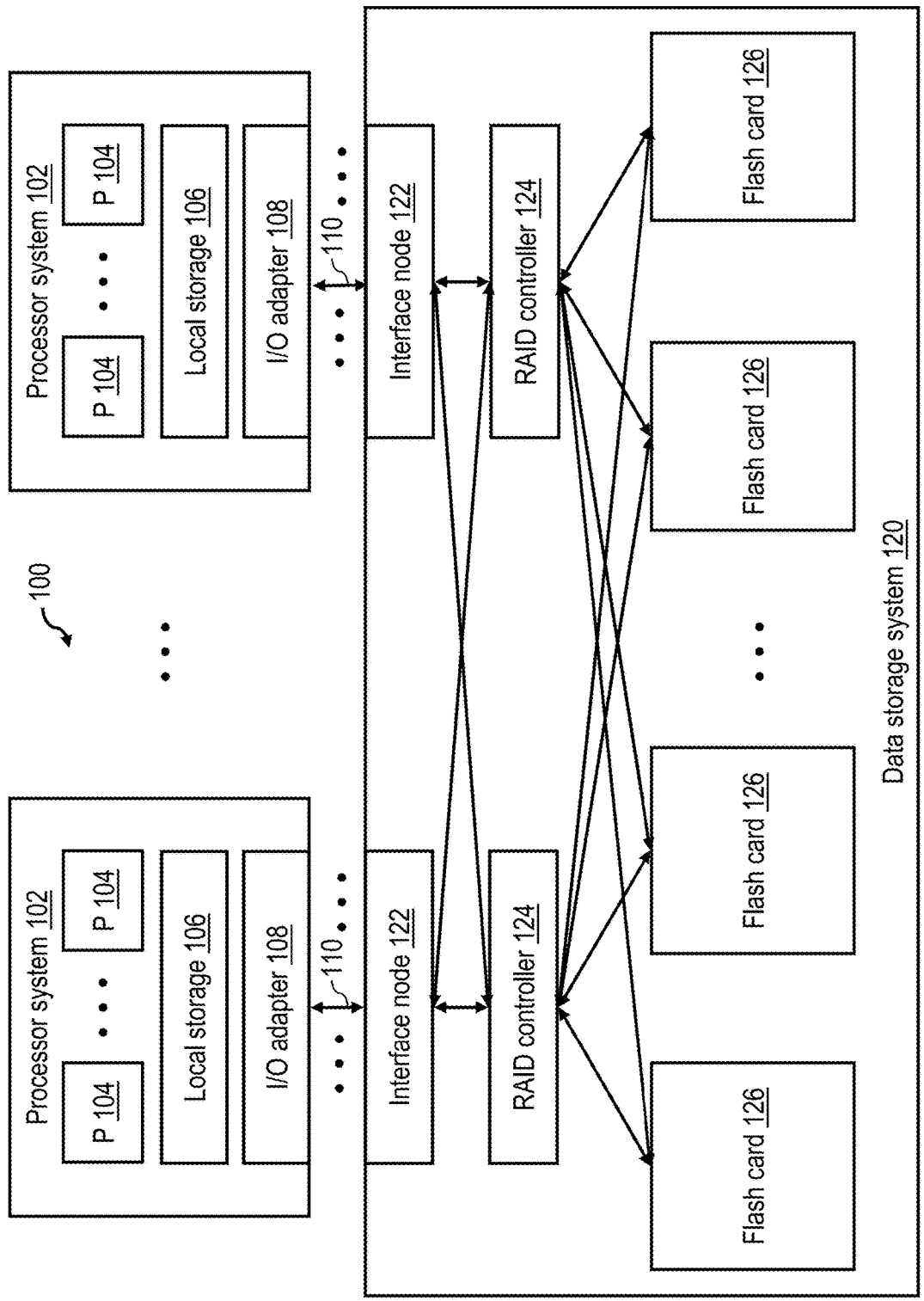
FIG. 1A is a high level block diagram of a data processing environment in accordance with one embodiment.

With reference to the figures and with particular reference to FIG. 1A, there is illustrated a high level block diagram of an exemplary data processing environment 100 including a data storage system 120 that is configured to perform data compression/decompression according to the present disclosure and having a non-volatile memory array as described further herein. As shown, data processing environment 100 includes one or more hosts, such as a processor system 102 having one or more processors 104 that process instructions and data. Processor system 102 may additionally include local storage 106 (e.g., Dynamic Random Access Memory (DRAM) or disks) that may store program code, operands and/or execution results of the processing performed by processor(s) 104. In various embodiments, processor system 102 can be, for example, a mobile computing device (such as a smartphone or tablet), a laptop or desktop personal computer system, a server computer system (such as one of the POWER® series available from International Business Machines Corporation), or a mainframe computer system. Processor system 102 can also be an embedded processor system using various processors such as ARM®, POWER, Intel X86, or any other processor combined with memory caches, memory controllers, local storage, I/O bus hubs, etc.

Each processor system 102 further includes an input/output (I/O) adapter 108 that is coupled directly (i.e., without any intervening device) or indirectly (i.e., through at least one intermediate device) to a data storage system 120 via an I/O channel 110. In various embodiments, an I/O channel 110 may employ any one or a combination of known or future developed communication protocols, including, for example, Fibre Channel (FC), FC over Ethernet (FCoE), Internet Small Computer System Interface (iSCSI), InfiniBand, Transport Control Protocol/Internet Protocol (TCP/IP), Peripheral Component Interconnect Express (PCIe), etc. I/O operations (IOPs) communicated via I/O channel 110 include read IOPs by which a processor system 102 requests data from data storage system 120 and write IOPs by which a processor system 102 requests storage of data in data storage system 120.

In the illustrated embodiment, data storage system 120 includes multiple interface nodes 122 through which data storage system 120 receives and responds to IOPs via I/O channels 110. Each interface node 122 is coupled to each of multiple Redundant Array of Inexpensive Disks (RAID) controllers 124 in order to facilitate fault tolerance and load balancing. Each of RAID controllers 124 is in turn coupled (e.g., by a PCIe bus) to each of multiple flash cards 126 including, in this example, NAND flash storage media. In other embodiments, other lossy storage media can be employed.

Figure 1B:
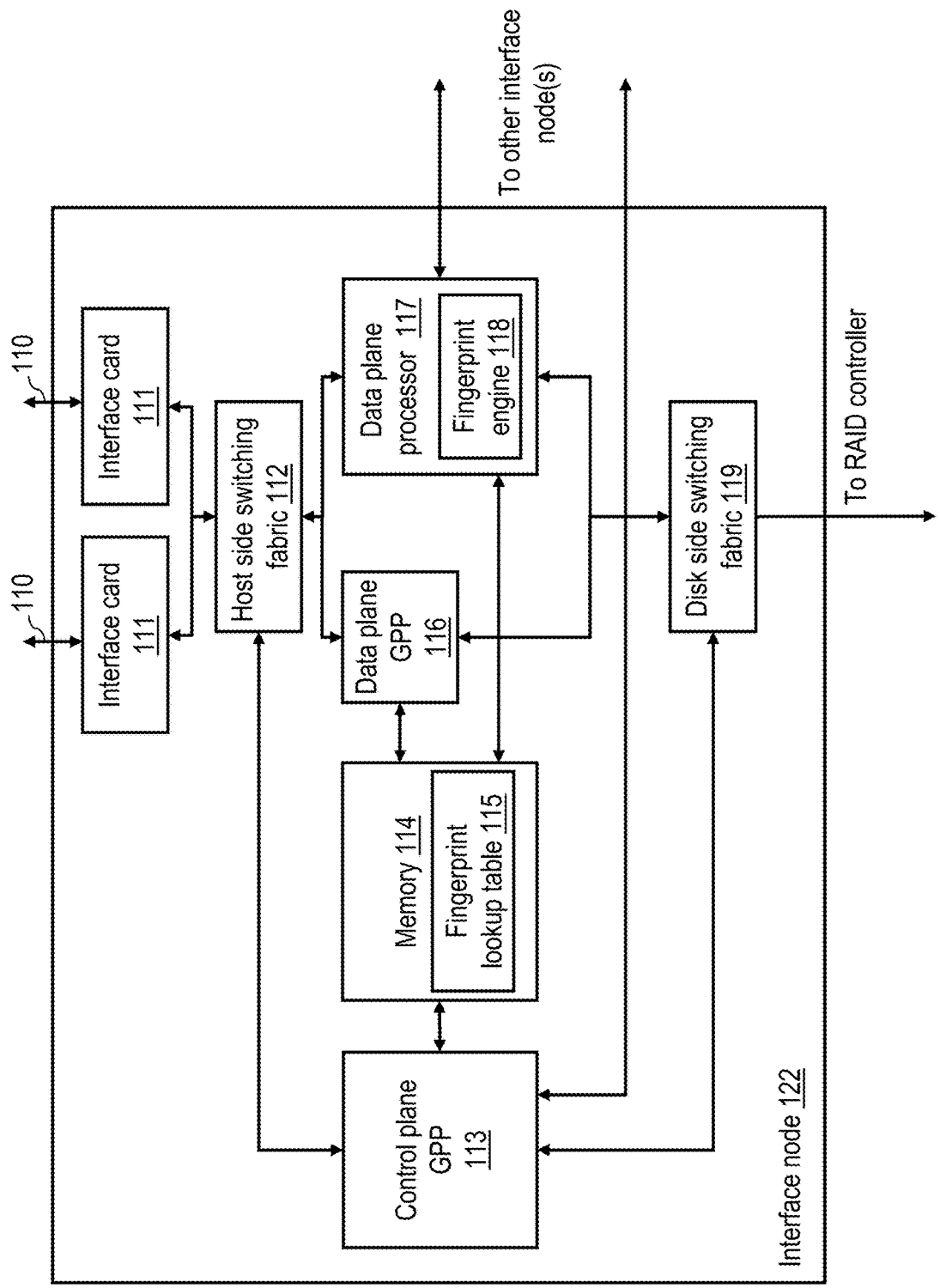
FIG. 1B is a more detailed block diagram of an exemplary interface node of the data storage system of FIG. 1A.

FIG. 1B depicts a more detailed block diagram of an interface node 122 of data storage system 120 of FIG. 1A. Interface node 122 includes one or more interface cards 111 that serve as an interface to processor systems 102 through I/O channels 110 and connect to host side switching fabric 112. The host side switching fabric 112 acts as a switch and handles all data transfers between interface cards 111 and processing units in interface node 122, namely control plane general purpose processor (GPP) 113, data plane GPP 116, and data plane processor 117. Typically, host side switching fabric 112 consist of a PCIe switch, but other switch technologies may be used as well. Data plane processor 117 is a special purpose processor that can be implemented, for example, by an Application Specific Integrated Circuit (ASIC) or a Field Programmable Gate Array (FPGA)). Control plane GPP 113, data plane GPP 116, and data plane processor 117 are all connected to memory 114 which may be implemented as a shared memory between these components, separate memories, or a combination thereof.

Data plane processor 117 implements a fingerprint engine 118 that generates fingerprints for received data pages that are to be written to or read from flash cards 126. Data plane processor 117 may further access a fingerprint lookup table (LUT) 115 stored in memory 114 either directly or by communicating with data plane GPP 116 or control plane GPP 113. Fingerprints for received data pages may include hashes, CRCs, or a combination of hashes and CRCs. Fingerprint engine 118 (or other logic in data plane processor 117) may also be configured to determine compressed page sizes of received data pages. Fingerprint LUT 115 stores fingerprints for data pages that are stored in flash cards 126. It should be appreciated that fingerprint LUT 115 may, at any given time, only store fingerprints for some of the data pages stored in flash cards 126 due to memory size limitations.

In embodiments in which data plane processor 117 is implemented with an FPGA, control plane GPP 113 may program and configure data plane processor 117 during start-up of data storage system 120. Data plane GPP 116 and control plane GPP 113 control data plane processor 117 as well as access to flash cards 126 either indirectly through the control of data plane processor 117 or directly through disk side switching fabric 119. Control plane GPP 113 executes system management functions as well as higher level services such as snapshots, thin provisioning, and deduplication. Data plane GPP 116 executes protocol specific functions. Control plane GPP 113, data plane GPP 116, and data plane processor 117 are connected to RAID controller 124 through disk side switching fabric 119 which typically consist of a PCIe switch, but other switch technologies may be used as well. FIG. 1B further illustrates control plane GPP 113 and data plane processor 117 being connected to other interface nodes 122 in data storage system 120 to handle fail-over scenarios or for performing other data synchronization functions.

Figure 1C:
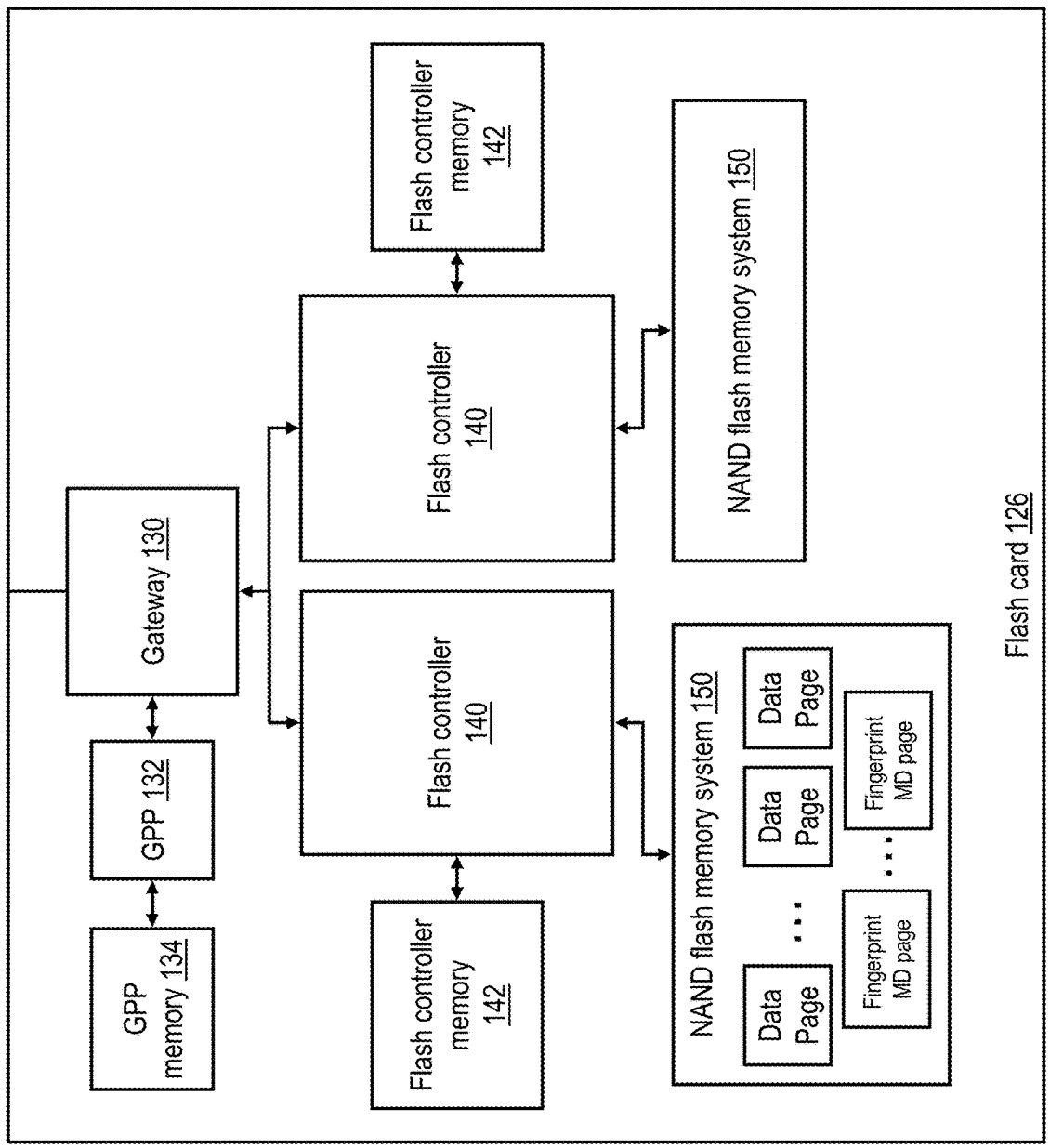
FIG. 1C is a more detailed block diagram of an exemplary flash card of the data storage system of FIG. 1A.

FIG. 1C depicts a more detailed block diagram of a flash card 126 of data storage system 120 of FIG. 1A. Flash card 126 includes a gateway 130 that serves as an interface between flash card 126 and RAID controllers 124. Gateway 130 is coupled to a general-purpose processor (GPP) 132, which can be configured (e.g., by program code) to perform various management functions, such as pre-processing of IOPs received by gateway 130 and/or to schedule servicing of the IOPs by flash card 126. GPP 132 is coupled to a GPP memory 134 (e.g., Dynamic Random Access Memory (DRAM) or Magneto-resistive Random Access Memory (MRAM)) that can conveniently buffer data created, referenced and/or modified by GPP 132 in the course of its processing.

Gateway 130 is further coupled to multiple flash controllers 140, each of which controls a respective NAND flash memory system 150. Flash controllers 140 can be implemented, for example, by an Application Specific Integrated Circuit (ASIC) or a Field Programmable Gate Array (FPGA)) having an associated flash controller memory 142 (e.g., DRAM). In embodiments in which flash controllers 140 are implemented with an FPGA, GPP 132 may program and configure flash controllers 140 during start-up of data storage system 120. After startup, in general operation flash controllers 140 receive read and write IOPs from gateway 130 that request to read data stored in NAND flash memory system 150 and/or to store data in NAND flash memory system 150. Flash controllers 140 service these IOPs, for example, by accessing NAND flash memory systems 150 to read or write the requested data from or into NAND flash memory systems 150 or by accessing one or more read and/or write caches (not illustrated in FIG. 1C) associated with NAND flash memory systems 150. For example, NAND flash memory systems 150 may store a combination of data pages and one or more fingerprint metadata (MD) pages that provide fingerprint metadata for one or more data pages. In an alternative embodiment, fingerprint MD may be stored in a different memory than data pages.

Flash controllers 140 implement a Flash Translation Layer (FTL) that provides logical-to-physical address translation to enable access to specific memory locations within NAND flash memory systems 150. In general, an IOP received by flash controller 140 from a host device, such as a processor system 102, contains the logical block address (LBA) at which the data is to be accessed (read or written) and, if a write IOP, the write data to be written to data storage system 120. The IOP may also specify the amount (or size) of the data to be accessed. Other information may also be communicated depending on the protocol and features supported by data storage system 120. As is known to those skilled in the art, NAND flash memory, such as that employed in NAND flash memory systems 150, is constrained by its construction such that the smallest granule of data that can be accessed by a read or write IOP is fixed at the size of a single flash memory page, for example, 16 kilobytes (kB). The LBA provided by the host device corresponds to a logical page within a logical address space, the logical page typically having a size of four (4) kilobytes. As such, more than one logical page may be stored in a physical flash page. The FTL translates this LBA into a physical address assigned to a corresponding physical location in a NAND flash memory system 150.

Flash controllers 140 may perform address translation and/or store mappings between logical and physical addresses in a logical-to-physical translation data structure, such as a logical-to-physical translation (LPT) table, which may conveniently be stored in flash controller memory 142. An LPT table may also be configured to store compressed page sizes of data pages stored in NAND flash memory system 150 and even further their CRC values.

NAND flash memory systems 150 may take many forms in various embodiments. Referring now to FIGS. 2-5, there is depicted one exemplary arrangement of physical memory within a NAND flash memory system 150 in accordance with one exemplary embodiment.

Figure 2:
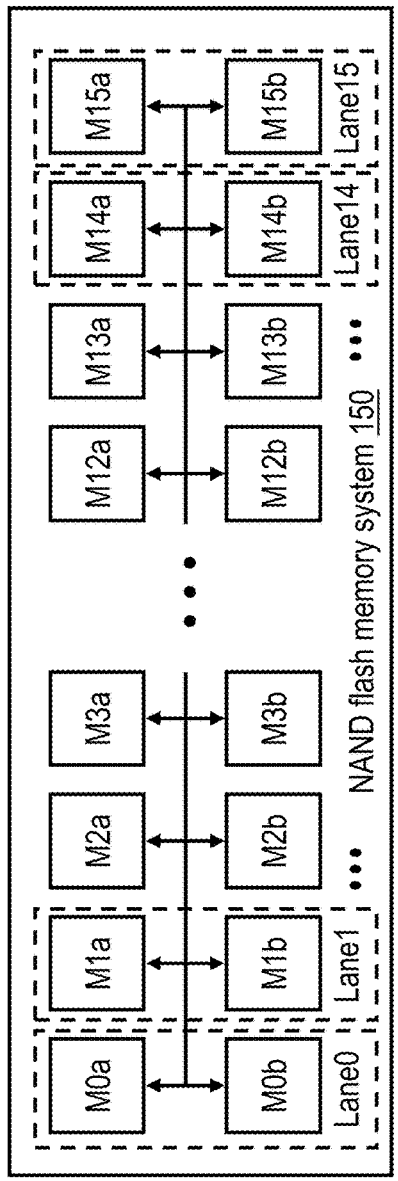
FIGS. 2-5 illustrate an exemplary arrangement of physical memory within a NAND flash memory system in accordance with the present disclosure.

As shown in FIG. 2, NAND flash memory system 150 may be formed from thirty-two (32) individually addressable NAND flash memory storage devices. In the illustrated example, each of the flash memory storage devices M0a-M15b takes the form of a board-mounted flash memory module capable of storing two or more bits per cell. Thus, flash memory modules may be implemented with Single Level Cell (SLC), Multi-Level Cell (MLC), Three Level Cell (TLC), or Quad Level Cell (QLC) memory. The thirty-two NAND flash memory modules are arranged in sixteen groups of two, (M0a, M0b) through (M15a, M15b). For purposes of the physical addressing scheme, each group of two modules forms a "lane," also sometimes referred to as a "channel," such that NAND flash memory system 150 includes sixteen channels or lanes (Lane0-Lane15).

In a preferred embodiment, each of the individual lanes has a respective associated bus coupling it to the associated flash controller 140. Thus, by directing its communications to one of the specific communication buses, flash controller 140 can direct its communications to one of the lanes of memory modules. Because each communication bus for a given lane is independent of the communication buses for the other lanes, a flash controller 140 can issue commands and send or receive data across the various communication buses at the same time, enabling the flash controller 140 to access the flash memory modules corresponding to the individual lanes at, or very nearly at, the same time.

Figure 3:
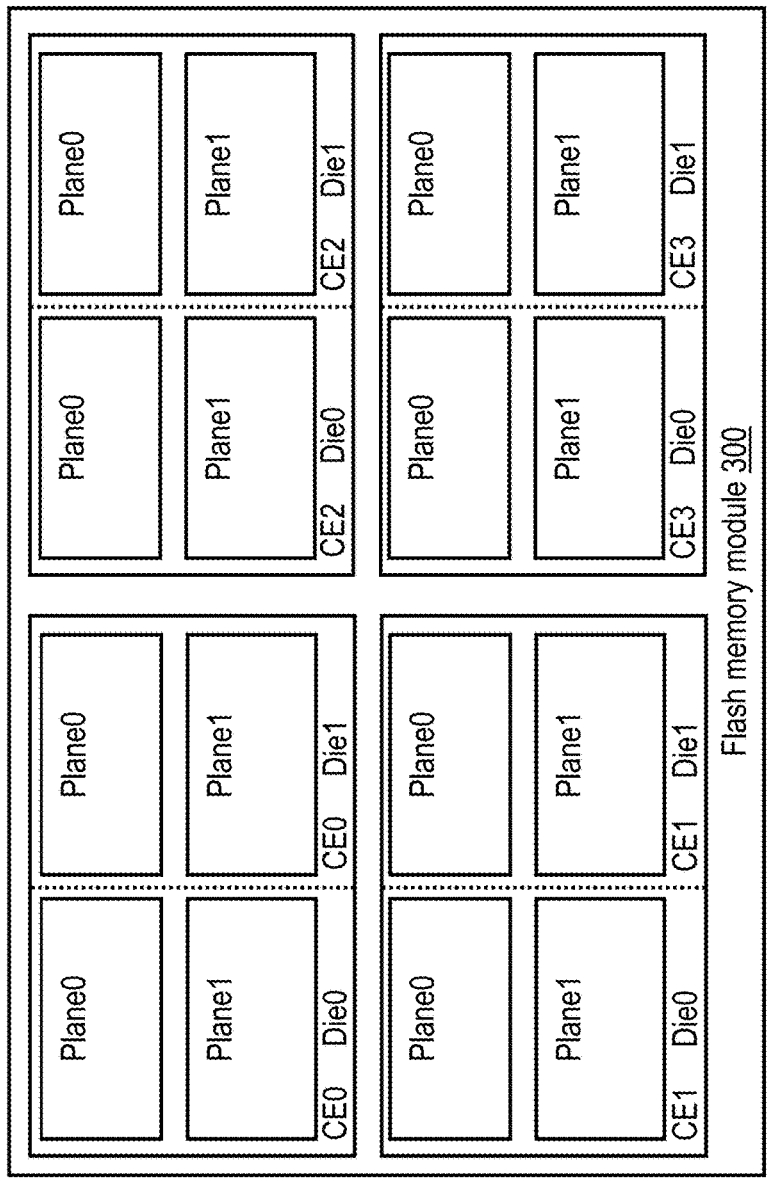

With reference now to FIG. 3, there is illustrated an exemplary embodiment of a flash memory module 300 that can be utilized to implement any of flash memory modules M0a-M15b of FIG. 2. As shown in FIG. 3, the physical storage locations provided by flash memory module 300 are further subdivided into physical locations that can be addressed and/or identified through Chip Enables (CEs). In the example of FIG. 3, the physical memory of each flash memory chip 300 is divided into four Chip Enables (CE0, CE1, CE2 and CE3), each having a respective CE line that is asserted by flash controller 140 to enable access to or from the physical memory locations within the corresponding CE. Each CE is in turn subdivided into multiple dice (e.g., Die0 and Die1) each having two planes (e.g., Plane0 and Plane1). Each plane represents a collection of blocks (described below) that, because of the physical layout of the flash memory chips, are physically associated with one another and that utilize common circuitry (e.g., I/O buffers) for the performance of various operations, such as read and write operations.

Figure 4:
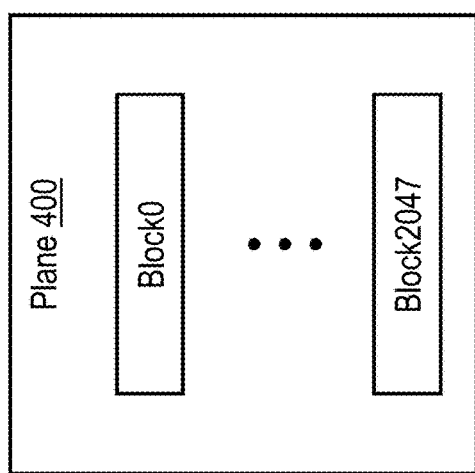
Figure 5:
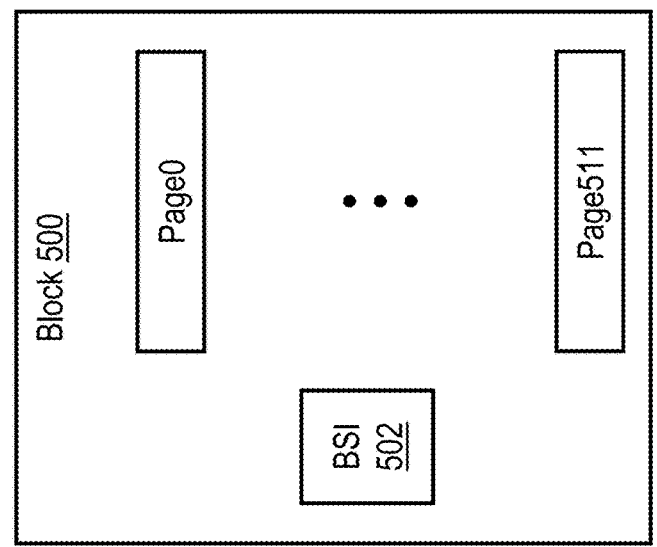

As further shown in FIGS. 4-5, an exemplary plane 400, which can be utilized to implement any of the planes within flash memory module 300 of FIG. 3, includes, for example, 1024 or 2048 blocks of physical memory. Note that manufacturers often add some additional blocks as some blocks might fail early. In general, a block is a collection of physical pages that are associated with one another, typically in a physical manner. This association is such that a block is defined to be the smallest granularity of physical storage locations that can be erased within NAND flash memory system 150. In the embodiment of FIG. 5, each block 500 includes, for example, 256 or 512 physical pages, where a physical page is defined to be the smallest individually addressable data unit for read and write access. In the exemplary system, each physical page of data has a common capacity (e.g., 16 kB) for data storage plus additional storage for metadata described in more detail below. Thus, data is written into or read from NAND flash memory system 150 on a page-by-page basis, but erased on a block-by-block basis.

If NAND flash memory system 150 is implemented in a memory technology supporting multiple bits per cell, it is common for multiple physical pages of each block 500 to be implemented in the same set of memory cells. For example, assuming 512 physical pages per block 500 as shown in FIG. 5 and two bits per memory cell (i.e., NAND flash memory 150 is implemented in MLC memory), Page0 through Page255 (the lower pages) can be implemented utilizing the first bit of a given set of memory cells and Page256 through Page511 (the upper pages) can be implemented utilizing the second bit of the given set of memory cells. The actual order of lower and upper pages may be interleaved and depends on the manufacturer. In many cases, the endurance of pages within a block 500 vary widely, and in some cases, this variation is particularly pronounced between lower pages (which may generally have a lower endurance) and upper pages (which may generally have a greater endurance).

As further shown in FIG. 5, each block 500 preferably includes block status information (BSI) 502, which indicates the status of each physical page in that block 500 as retired (i.e., no longer used to store user data) or non-retired (i.e., active or still usable to store user data). In various implementations, BSI 502 can be collected into a single data structure (e.g., a vector or table) within block 500, distributed within block 500 (e.g., as one or more bits of metadata appended to each physical page) and/or maintained elsewhere in data storage system 120. As one example, in the embodiment illustrated in FIG. 9 and discussed further below, the page status information of all blocks 500 in a NAND flash memory system 150 is collected in a system-level data structure, for example, a page status table (PST) 946 stored in GPP memory 134 or a flash controller memory 142.

Because the FTL implemented by data storage system 120 isolates the logical address space made available to host devices from the physical memory within NAND flash memory system 150, the size of NAND flash memory system 150 need not be equal to the size of the logical address space presented to host devices. In most embodiments it is beneficial to present a logical address space that is less than the total available physical memory (i.e., to over-provision NAND flash memory system 150). Overprovisioning in this manner ensures that physical memory resources are available when the logical address space is fully utilized, even given the presence of a certain amount of invalid data as described above. In addition to invalid data that has not yet been reclaimed the overprovisioned space can be used to ensure there is enough logical space, even given the presence of memory failures and the memory overhead entailed by the use of data protection schemes, such as Error Correcting Code (ECC), Cyclic Redundancy Check (CRC), and parity.

Figure 6A:
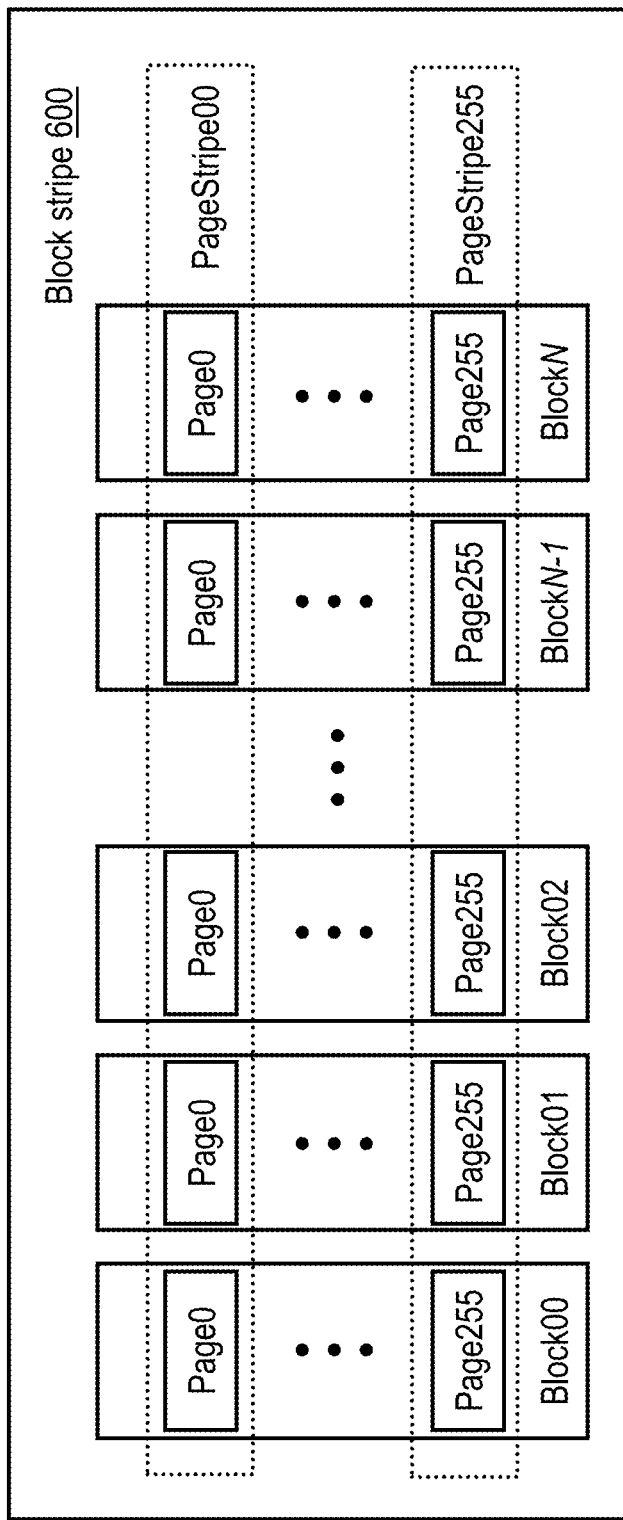
FIG. 6A depicts an exemplary implementation of a block stripe in accordance with the present disclosure.

In some embodiments, data is written to NAND flash memory system 150 one physical page at a time. In other embodiments in which more robust error recovery is desired, data is written to groups of associated physical pages of NAND flash memory system 150 referred to herein as "page stripes." In a disclosed embodiment, all pages of a page stripe are associated with different lanes to achieve high write bandwidth. Because in many implementations the smallest erase unit is a block, page stripes can be grouped into a block stripe as is shown in FIG. 6A, where each block in the block stripe is associated with a different lane. When a block stripe is built, any free block of a lane can be chosen, but preferably all blocks within the same block stripe have the same or similar health grade. Note that the block selection can be further restricted to be from the same plane, die, and/or chip enable. The lengths of the block stripes can and preferably do vary, but in one embodiment in which NAND flash memory system 150 includes 16 lanes, each block stripe includes between two and sixteen blocks, with each block coming from a different lane. Further details regarding the construction of block stripes of varying lengths can be found in U.S. Pat. Nos. 8,176,284; 8,176,360; 8,443,136; and 8,631,273, which are incorporated herein by reference in their entireties.

Figure 6B:
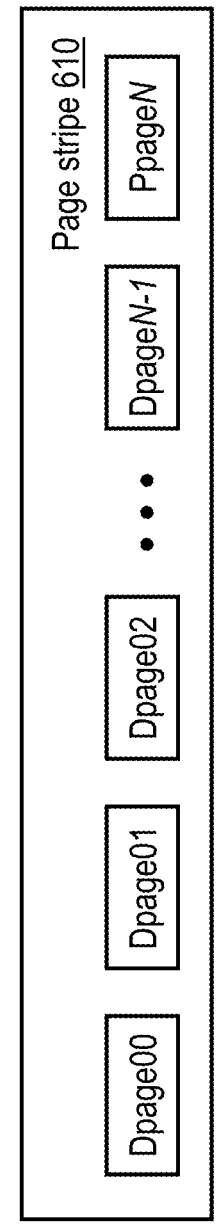
FIG. 6B depicts an exemplary implementation of a page stripe in accordance with the present disclosure.

Once a block from each lane has been selected and a block stripe is formed, page stripes are preferably formed from physical pages with the same page number from all blocks in the block stripe. While the lengths of the various page stripes stored into NAND flash memory system 150 can and preferably do vary, in one embodiment each page stripe includes one to fifteen data pages of write data (typically provided by a host device) and one additional page (a "data protection page") used to store data protection information for the write data. For example, FIG. 6B illustrates an exemplary page stripe 610 including N data pages (i.e., Dpage00 through DpageN-1) and one data protection page (i.e., PpageN). The data protection page can be placed on any lane of the page stripe containing a non-retired page, but typically is on the same lane for all page stripes of the same block stripe to minimize metadata information. The addition of a data protection page as illustrated requires that garbage collection be performed for all page stripes of the same block stripe at the same time. After garbage collection of the block stripe completes, the block stripe can be dissolved, and each block can be placed into the relevant ready-to-use (RTU) queue as explained below. Similarly to logical data pages that are being placed into page stripes of a block stripe, fingerprint MD pages may be placed there as well. Logical data pages and fingerprint MD pages may be intermingled. In fact, flash card 126 may actually not know the difference between regular logical data pages and fingerprint MD pages. The fingerprint MD pages may be stored on a dedicated meta-data volume controlled by the interface nodes 122 and not visible to the processor system 102. As the flash cards 126 have no notion of volumes, fingerprint MD page operations are handled as regular read and write operations.

FIG. 7 illustrates an exemplary format of a codeword stored in each data page within page stripe 610 of FIG. 6B. Typically, a positive integer number of codewords, for example, 2 or 3, are stored in each data page, but an alternative embodiment may also store a single codeword in a data page. In this example, each codeword 700 includes a data field 702, as well as additional fields for metadata describing the data page. Depending on the size of the codeword, the data field 702 holds data for one or more logical pages. In another embodiment it may also hold fractions of data of logical data pages. In the illustrated example, metadata fields include an LBA field 704 containing the LBAs stored in codeword 700, a CRC field 706 containing the CRC value computed for the combination of data field 702 and LBA field 704, and an ECC field 708 containing an ECC value calculated, in the illustrated example, from a combination of contents of data field 702, LBA field 704, and CRC field 706. In case data field 702 holds fractions of logical data pages, LBA field 704 further holds information on which fractions of logical data pages are stored in data field 702.

FIG. 8 depicts an exemplary format of a codeword in the data protection page of page stripe 610 of FIG. 6. In one embodiment, each data protection page stores a positive integer number of codewords, but an alternative embodiment a data protection page may store a single codeword. In the depicted example, data protection codeword 800 includes a data XOR field 802 that contains the bit-by-bit Exclusive OR (XOR) of the contents of the data fields 702 of the codewords 700 in page stripe 610. Data protection codeword 800 further includes an LBA XOR field 804 that contains the bit-by-bit XOR of LBA fields 704 of codewords 700 in page stripe 610. Data protection codeword 800 finally includes a CRC field 806 and ECC field 808 for respectively storing a CRC value and an ECC value for data protection codeword 800. Such a protection scheme is commonly referred to as RAID 5, since the parity field will not always be located on one particular flash plane. However, it should be appreciated that alternate data protection schemes such as Reed-Solomon can alternatively or additionally be used.

The formats for data pages and data protection pages described above protect data stored in a page stripe using multiple different data protection mechanisms. First, the use of the ECC bits in each data codeword of a data page allows the correction of some number of bit errors within the codeword in a flash page. Depending on the ECC method used it may be possible to correct hundreds of bits or even thousands of bits within a NAND flash page. After ECC checking and correction is performed, the corrected CRC field is used to validate the corrected data. Used together, these two mechanisms allow for the correction of relatively benign errors and the detection of more serious errors using only local intra-page information. Should an uncorrectable error occur in a data page, for example, due to failure of the physical page utilized to store the data page, the contents of the data field and LBA field of the failing data page may be reconstructed from the other data pages and the data protection page for the page stripe.

While the physical memory locations in which the data pages and data protection page of a page stripe will vary within NAND flash memory system 150, in one embodiment the data pages and data protection page that comprise a given page stripe are preferably stored in physical memory locations selected to optimize the overall operation of the data storage system 120. For example, in some embodiments, the data pages and data protection page comprising a page stripe are stored such that different physical lanes are employed to store each of the data pages and data protection page. Such embodiments support efficient access to a page stripe because flash controller 140 can access all of the pages of data that comprise the page stripe simultaneously or nearly simultaneously. It should be noted that the assignment of pages to lanes need not be sequential (i.e., data pages can be stored in any lane in any order), and unless a page stripe is a full length page stripe (e.g., containing fifteen data pages and one data protection page), the lanes utilized to store the page stripe need not be adjacent.

Having described the general physical structure and operation of one exemplary embodiment of a data storage system 120, certain operational aspects of data storage system 120 are now described with reference to FIG. 9, which is a high level flow diagram of the flash management functions and data structures employed by GPP 132 and/or flash controllers 140 in accordance with one embodiment.

As noted above, data storage system 120 does not generally allow external devices to directly address and/or access the physical memory locations within NAND flash memory systems 150. Instead, data storage system 120 is generally configured to present a single contiguous logical address space to the external devices, thus allowing host devices to read and write data to and from LBAs within the logical address space while permitting flash controllers 140 and GPP 132 to control where the data that is associated with the various LBAs actually resides in the physical memory locations comprising NAND flash memory systems 150. In this manner, performance and longevity of NAND flash memory systems 150 can be intelligently managed and optimized. In the illustrated embodiment, each flash controller 140 manages the logical-to-physical translation using a logical-to-physical translation data structure, such as logical-to-physical translation (LPT) table 900, which can be stored in the associated flash controller memory 142. As mentioned above, an LPT table, such as LPT table 900, can also be configured to store compressed page sizes of data pages stored in NAND flash memory systems 150 to aid in data deduplication.

Flash management code running on the GPP 132 tracks erased blocks of NAND flash memory system 150 that are ready to be used in ready-to-use (RTU) queues 906, which may be stored, for example, in GPP memory 134. In the depicted embodiment, management code running on the GPP 132 preferably maintains one or more RTU queues 906 per channel, and an identifier of each erased block that is to be reused is enqueued in one of RTU queues 906 corresponding to its channel. For example, in one embodiment, RTU queues 906 include, for each channel, a respective RTU queue 906 for each of a plurality of block health grades. In various implementations, between 2 and 8 RTU queues 906 per lane (and a corresponding number of block health grades) have been found to be sufficient.

A build block stripes function 920 performed by flash management code running on GPP 132 constructs new block stripes for storing data and associated parity information from the erased blocks enqueued in RTU queues 906. As noted above with reference to FIG. 6A, block stripes are preferably formed of blocks of the same or similar health (i.e., expected remaining useful life) residing in different channels, meaning that build block stripes function 920 can conveniently construct a block stripe by drawing each block of the new block stripe from corresponding RTU queues 906 of different channels. The new block stripe is then queued to flash controller 140 for data placement.

In response to a write IOP received from a host, such as a processor system 102, a data placement function 910 of flash controller 140 determines by reference to LPT table 900 whether the target LBA(s) indicated in the write request is/are currently mapped to physical memory page(s) in NAND flash memory system 150 and, if so, changes the status of each data page currently associated with a target LBA to indicate that it is no longer valid. In addition, data placement function 910 allocates a page stripe if necessary to store the write data of the write IOP and any non-updated data (i.e., in case the write request is smaller than a logical page, there is still valid data which needs to be handled in a read-modify-write manner) from an existing page stripe, if any, targeted by the write IOP, and/or stores the write data of the write IOP and any non-updated (i.e., still valid) data from an existing page stripe, if any, targeted by the write IOP to an already allocated page stripe which has free space left. The page stripe may be allocated from either a block stripe already allocated to hold data or from a new block stripe built by build block stripes function 920. In a preferred embodiment, the page stripe allocation can be based on the health of the blocks available for allocation and the "heat" (i.e., estimated or measured write access frequency) of the LBA of the write data. Data placement function 910 then writes the write data, associated metadata (e.g., CRC and ECC values), for each codeword in each page of the page stripe, and parity information for the page stripe in the allocated page stripe. The associated metadata and parity information can be written to storage as soon as enough host data has been placed into the page stripe. Flash controller 140 also updates LPT table 900 to associate the physical page(s) utilized to store the write data with the LBA(s) indicated by the host device. Thereafter, flash controller 140 can access the data to service host read IOPs by reference to LPT table 900 as further illustrated in FIG. 9.

Once all pages in a block stripe have been written, flash controller 140 places the block stripe into one of occupied block queues 902, which flash management code running on GPP 132 utilizes to facilitate garbage collection. As noted above, through the write process, pages are invalidated, and therefore portions of NAND flash memory system 150 become unused. An associated flash controller 140 (and/or GPP 132) eventually needs to reclaim this space through garbage collection performed by a garbage collector 912. Garbage collector 912 selects particular block stripes for garbage collection based on a number of factors including, for example, the health of the blocks within the block stripes and how much of the data within the erase blocks is invalid. In the illustrated example, garbage collection is performed on entire block stripes, and flash management code running on GPP 132 logs the block stripes ready to be recycled in a relocation queue 904, which can conveniently be implemented in the associated flash controller memory 142 or GPP memory 134.

The flash management functions performed by GPP 132 or flash controller 140 additionally include a relocation function 914 that relocates the still valid data held in block stripes enqueued in relocation queue 904. To relocate such data, relocation function 914 issues relocation write requests to data placement function 910 to request that the data of the old block stripe be written to a new block stripe in NAND flash memory system 150. In addition, relocation function 914 updates LPT table 900 to remove the current association between the logical and physical addresses of the data. Once all still valid data has been moved from the old block stripe, the old block stripe is passed to dissolve block stripes function 916, which decomposes the old block stripe into its constituent blocks, thus disassociating the blocks. Flash controller 140 then erases each of the blocks formerly forming the dissolved block stripe and increments an associated program/erase (P/E) cycle count for the block in P/E cycle counts 944. Based on the health metrics of each erased block, each erased block is either retired (i.e., no longer used to store user data) by a block retirement function 918 among the flash management functions executed on GPP 132, or alternatively, prepared for reuse by placing the block's identifier on an appropriate ready-to-use (RTU) queue 906 in associated GPP memory 134.

Figure 9:
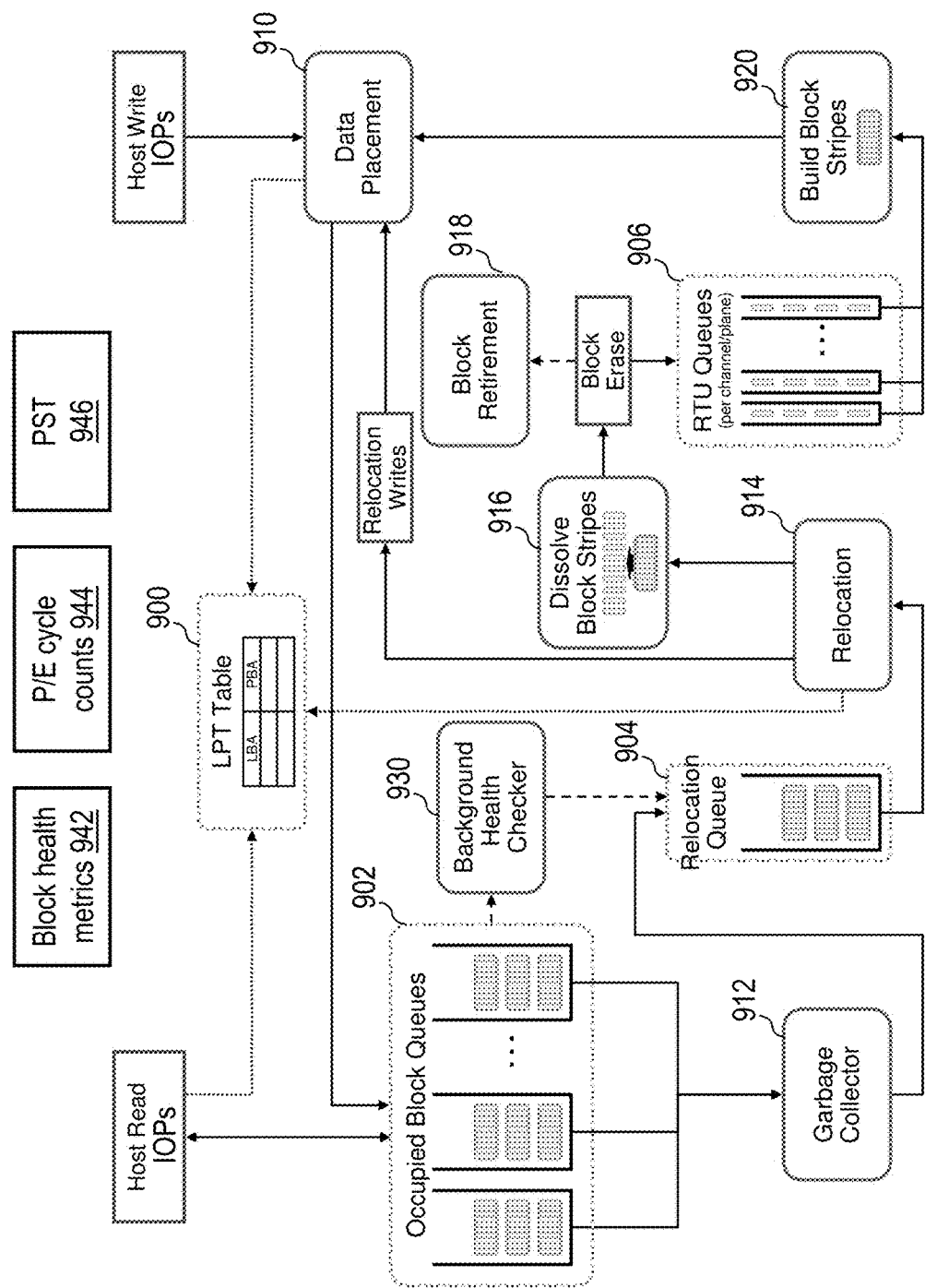
FIG. 9 is a high level flow diagram of the flash management functions and data structures employed by a flash controller in accordance with one embodiment of the present disclosure.

As further shown in FIG. 9, flash management functions executed on GPP 132 include a background health checker 930. Background health checker 930, which operates independently of the demand read and write IOPs of hosts such as processor systems 102, continuously determines one or more block health metrics 942 for blocks belonging to block stripes recorded in occupied block queues 902. Based on the one or more of block health metrics 942, background health checker 930 may place block stripes on relocation queue 904 for handling by relocation function 914.

Figure 10:
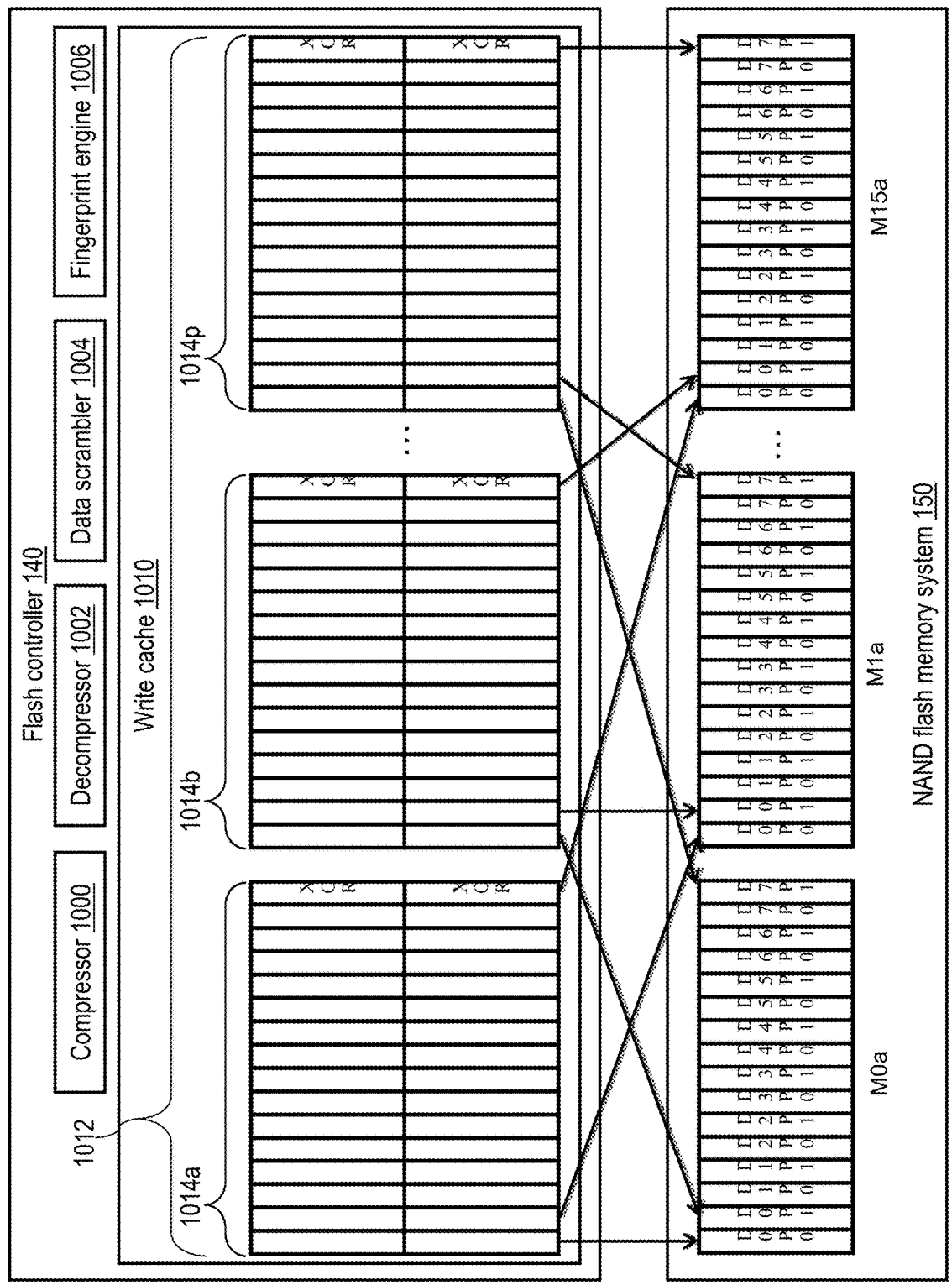
FIG. 10 depicts a more detailed view of an exemplary flash controller in accordance with one embodiment of the present disclosure.

Referring now to FIG. 10, there is depicted a more detailed view of a flash controller 140 in accordance with one embodiment. In this embodiment, flash controller 140 is configured (e.g., in hardware, firmware, software or some combination thereof) to support retirement of memory in flash memory modules M0a, M0b, M1a, M1b, . . . M1a, and M15b of a NAND flash memory system 150, for example, on a page-by-page basis rather than on a block-by-block basis, or a combination thereof. Flash controller 140 may be further configured to retire a physical page of memory while still keeping active other physical page(s) sharing a common set of multiple-bit memory cells with the retired physical page.

In the illustrated embodiment, flash controller 140 includes a compressor 1000 that selectively applies one or more data compression algorithms to data written to the associated NAND flash memory system 150, a decompressor 1002 that decompresses compressed data read from NAND flash memory system 150, and a data scrambler 1004. Flash controller 140 may also include an optional fingerprint engine 1006 similar to the fingerprint engine 118 in interface node 122. Flash controller 140 utilizes data scrambler 1004 to apply a predetermined data scrambling (i.e., randomization) pattern to data written to NAND flash memory 150 in order to improve endurance and mitigate cell-to-cell interference.

As further illustrated in FIG. 10, flash controller 140 includes a write cache 1010. Write cache 1010 includes storage for one or more cache lines 1012 for buffering write data in anticipation of writing the data to NAND flash memory system 150. In the illustrated embodiment, each cache line 1012 includes multiple (e.g., 16) segments 1014a-1014p, each providing storage for a respective page stripe of up to sixteen data pages (a maximum of fifteen data pages and one data protection page). As shown, for ease of implementation, it is preferred if flash controller 140 writes each page buffered in a given segment 1014 of cache line 1012 to the corresponding die index, plane index, and physical page index in each of sixteen flash memory modules. Thus, for example, flash controller 140 writes the data pages from segment 1014a to a first physical page (e.g., Page23) in each of flash memory modules M0a-M15a, writes the data pages from segment 1014b to a second physical page in each of flash memory modules M0a-M15a, and writes the data pages from segment 1014p to a sixteenth physical page in each of flash memory modules M0a-M15a.

Figure 11:
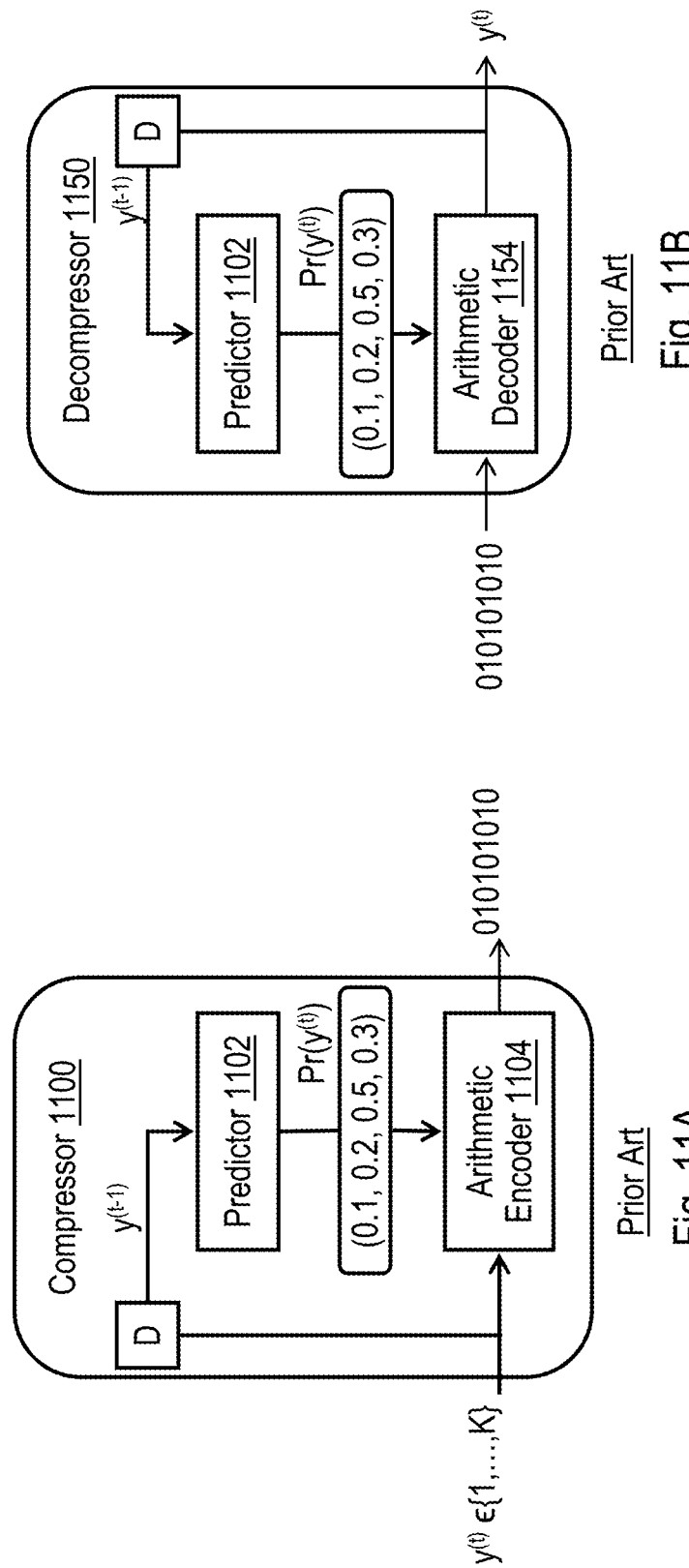
FIG. 11A depicts a block diagram of an exemplary conventional compressor.
FIG. 11B depicts a block diagram of an exemplary conventional decompressor.

With reference to FIGS. 11A and 11B, an exemplary conventional compressor 1100 and an exemplary conventional decompressor 1150 are illustrated, in block diagram form, that each implement adaptive coding. It should be appreciated that in data storage systems configured according to the present disclosure conventional compressor 1100 is replaced by compressor 1000 and conventional decompressor 1150 is replaced by decompressor 1002. Compressor 1100 and decompressor 1150 each include a predictor 1102 that examines all previous symbols $(y^{(1)}, y^{(2)}, \ldots, y^{(t-1)})$ and produces a set of predictions $Pr(y^{(t)})$ regarding the value of a next symbol $y^{(t)}$. Arithmetic encoder 1104 produces an output stream based on the set of predictions $Pr(y^{(t)})$ and received input symbols, where each input symbol is represented by $\log[1/Pr(y^{(t)})]$ bits. If predictions by predictor 1102 are good (i.e., if $Pr(y^{(t)}) > 1/K$, where 'K' is the number of symbols in an alphabet) then compression occurs in the output stream. It should be appreciated that in order to precisely invert the compression process the set of predictions $Pr(y^{(t)})$ generated by predictor 1102 of decompressor 1150 must be exactly the same those generated by predictor 1102 of compressor 1100. The output from predictor 1102 of decompressor 1150 is provided as an input to an arithmetic decoder 1154, which decodes a compressed input stream to generate a decompressed symbol based on the input.

Figure 12:
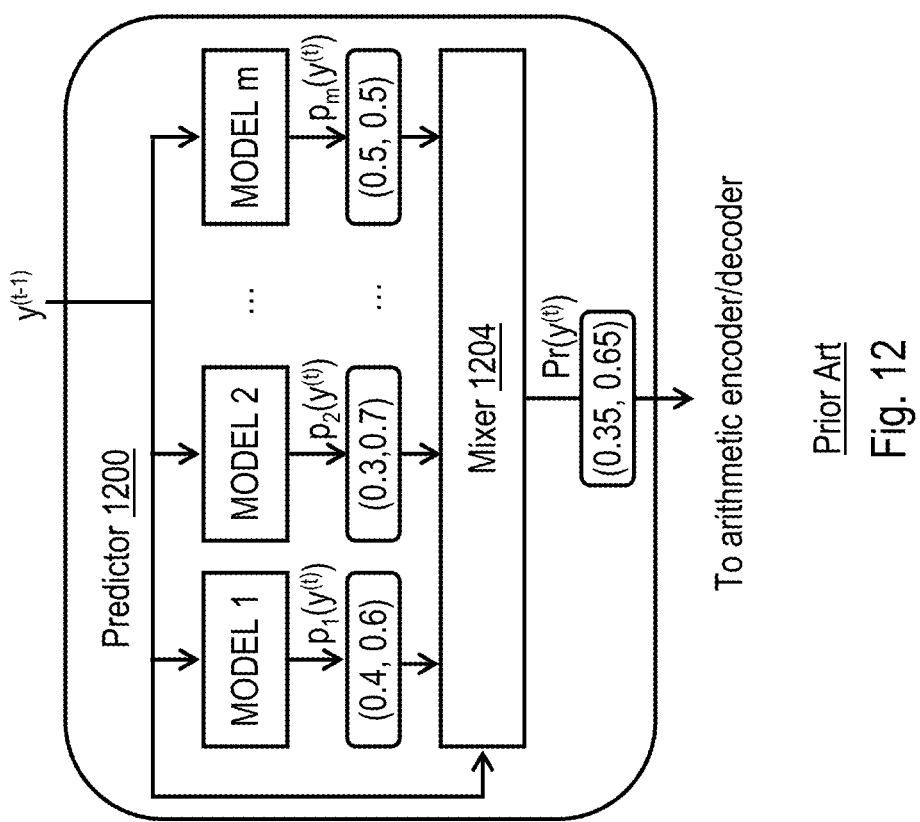
FIG. 12 depicts a block diagram of an exemplary conventional predictor that performs prediction by context mixing.

With reference to FIG. 12, an exemplary conventional predictor 1200 is illustrated, in block diagram form, that performs prediction by context mixing. Predictor 1200 includes an ensemble of 'm' different models that each produce predictions regarding a value of a next symbol and a mixer 1204 that combines the predictions from all of the models into a final prediction. Mixer 1204 may, for example, average the model predictions as follows:

$$Pr(y^{(t)}=k)=1/m*[p_1(y^{(t)}=k)+p_2(y^{(t)}=k)+\ldots+p_m(y^{(t)}=k)]$$

Figure 13:
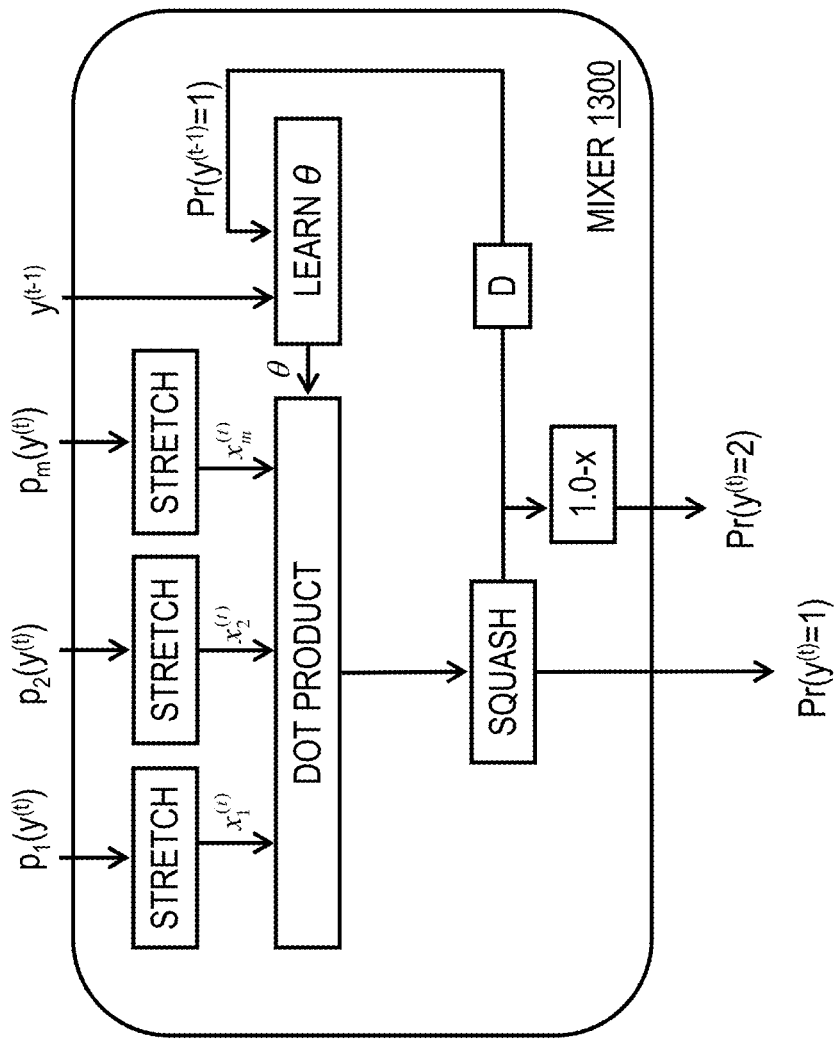
FIG. 13 depicts a block diagram of an exemplary conventional mixer that performs logistic mixing.

With reference to FIG. 13, an exemplary conventional mixer 1300 that performs logistic mixing is illustrated in block diagram form. Logistic mixing is equivalent to logistic regression where the weights are optimized by stochastic gradient descent. However, logistic mixing is only defined for K=2. From the model predictions $p_i=p_i(y^{(t)})$ a feature vector $x^{(t)}$ is computed as follows:

$$x^{(t)} = [\text{stretch}(p_1(y^{(t)})), \text{stretch}(p_2(y^{(t)})), \ldots, \text{stretch}(p_m(y^{(t)}))]$$

$$= \left[\frac{\log p_1(y^{(t)}=1)}{\log p_1(y^{(t)}=2)}, \frac{\log p_2(y^{(t)}=1)}{\log p_2(y^{(t)}=2)}, \ldots, \frac{\log p_m(y^{(t)}=1)}{\log p_m(y^{(t)}=2)}\right] \in \mathbb{R}^m$$

Given weight vector $\theta=(\theta_1, \theta_2, \ldots, \theta_m)$ a final prediction may be computed as follows:

$$Pr(y^{(t)}=1) = \text{squash}\left(\sum_{i=1}^{m} \theta_i x_i^{(t)}\right) = \left(1 + \exp\left[-\sum_{i=1}^{m} \theta_i x_i^{(t)}\right]\right)^{-1}$$

$$Pr(y^{(t)}=2) = 1 - Pr(y^{(t)}=1)$$

As is known, the squash function is a common logistic function used in neural networks. The weight vector may then be adjusted using, for example, stochastic gradient descent (SGD) to maximize compression as follows:

$$\theta_i := \theta_i + \alpha(y^{(t-1)} - Pr(y^{(t-1)}=1))x_i^{(t-1)}$$

where $\alpha$ is a gradient descent step-size parameter.

Various embodiments of the present disclosure are directed to a non-binary maximum entropy context mixing compressor/decompressor that includes an arithmetic encoder/decoder that operates on symbols that belong to an alphabet of size K>2. According to one or more embodiments, the compressor/decompressor includes a context model ensemble (i.e., a plurality of context models) that produces predictions regarding a value of a next symbol to be encoded and a mixer that creates a feature matrix $x^{(t)}$ from the context model predictions and trains a maximum entropy classifier (e.g., using stochastic gradient descent (SGD)) that produces a final prediction. The final prediction from the mixer is provided as an input to the arithmetic encoder/decoder. It should be appreciated that different embodiments can be implemented by placing a different number of constraints on the maximum entropy classifier (thus leading to a different number of mixing weights). It should be appreciated that training techniques other than SGD may be used to train the classifier (e.g., mini batch gradient descent or noise contrastive estimation may be used to train the classifier). In general, the only constraint is that the weights used to form a prediction $Pr(y^{(t)}|x^{(t)})$ in the compressor are trained using knowledge of symbols $y^{(1)}, \ldots y^{(t-1)}$ so that the exact same training can occur in the decompressor. As one example, a neural network mixer may be built by chaining maximum entropy mixers into multiple layers.

According to one or more embodiments of the present disclosure a non-binary maximum entropy context mixing compressor/decompressor is disclosed that redefines the stretch function for general K>2 as follows:

$$\text{stretch}_K(p_i) =$$
$$\left(\frac{\log p_i(y^{(t)}=1)}{\log p_i(y^{(t)}=K)}, \frac{\log p_i(y^{(t)}=2)}{\log p_i(y^{(t)}=K)}, \ldots, \frac{\log p_i(y^{(t)}=K-1)}{\log p_i(y^{(t)}=K)}\right) \in \mathbb{R}^{K-1}$$

It should be appreciated that an underlying idea is to remove redundant information coming from the models (as the probabilities of all symbols should sum to 1). It should also be appreciated that one does not necessarily have to divide by symbol 'K', i.e., dividing by any symbol works as long as the symbol is fixed.

Then the generalized feature matrix $x^{(t)}$ is then given by:

$$x^{(t)} = \begin{pmatrix} stretch_K(p_1(y^{(t)})) \\ stretch_K(p_2(y^{(t)})) \\ \vdots \\ stretch_K(p_m(y^{(t)})) \end{pmatrix} =$$

$$\begin{pmatrix} \frac{\log p_1(y^{(t)}=1)}{\log p_1(y^{(t)}=K)} & \frac{\log p_1(y^{(t)}=2)}{\log p_1(y^{(t)}=K)} & \cdots & \frac{\log p_1(y^{(t)}=K-1)}{\log p_1(y^{(t)}=K)} \\ \frac{\log p_2(y^{(t)}=1)}{\log p_2(y^{(t)}=K)} & \frac{\log p_2(y^{(t)}=2)}{\log p_2(y^{(t)}=K)} & \cdots & \frac{\log p_2(y^{(t)}=K-1)}{\log p_2(y^{(t)}=K)} \\ \vdots & \vdots & \ddots & \vdots \\ \frac{\log p_m(y^{(t)}=1)}{\log p_m(y^{(t)}=K)} & \frac{\log p_m(y^{(t)}=2)}{\log p_m(y^{(t)}=K)} & \cdots & \frac{\log p_m(y^{(t)}=K-1)}{\log p_m(y^{(t)}=K)} \end{pmatrix} \in \mathbb{R}^{m \times (K-1)}$$

According to one or more embodiments, a maximum entropy mixer may take the following form:

$$Pr(y^{(t)}=k \mid x^{(t)}) = \begin{cases} \frac{1}{Z}\exp[f_\theta(k, x^{(t)})] & \text{if } k=1, 2, \ldots, K-1 \\ \frac{1}{Z} & \text{otherwise} \end{cases}$$

where $f_\theta(k, x^{(t)})$ is some linear combination of the entries of the feature matrix and Z is a scalar referred to as the normalizing constant.

Figure 14:
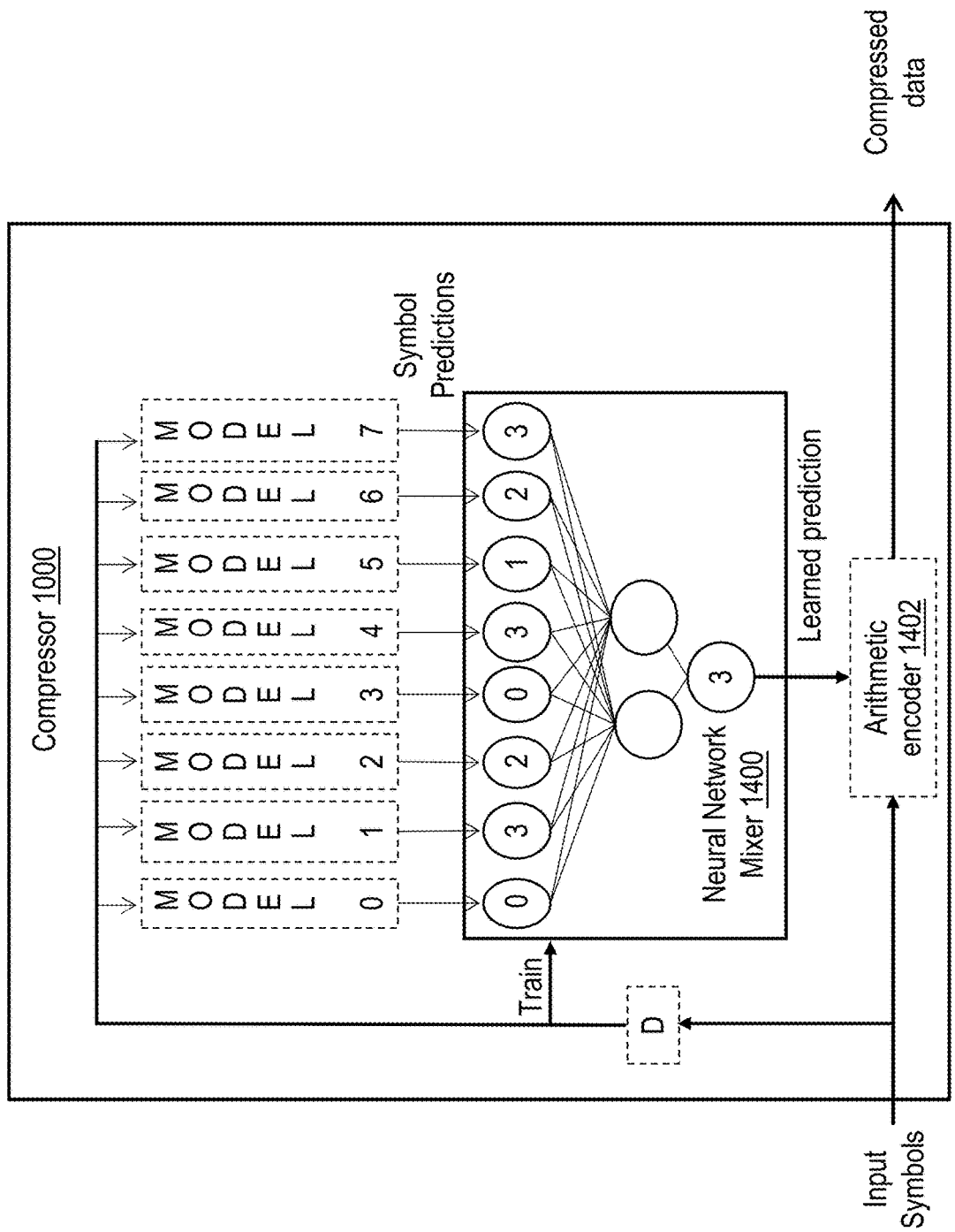
FIG. 14 depicts a block diagram of an exemplary compressor configured according to an embodiment of the present disclosure.

With reference to FIG. 14, compressor 1000 of FIG. 10 is illustrated in additional detail. As is illustrated, compressor 1000 includes a number of context models (only eight of which are shown in FIG. 14) whose outputs are provided to inputs of neural network mixer 1400. A learned prediction is provided from mixer 1400 to arithmetic encoder 1402 to facilitate generating compressed data from input symbols.

With reference to FIG. 15, table 1500 illustrates equations for three different embodiments, i.e., embodiments 'A', 'B', and 'C', that maximize entropy under slightly different constraints, according to the present disclosure. The predictor in embodiment 'C' has the same functional form as the predictor derived by Mattern (see Mattern, C., "Mixing Strategies in Data Compression," in *Data Compression Conference (DCC)*, 2012, pp. 337-346). However, the Mattern predictor required that weights $\theta_i$ be non-zero and sum to one. The disclosed maximum entropy mixer does not, however, require that weights $\theta_i$ be non-zero and sum to one. Embodiment 'A' imposes the fewest constraints and thus results in the largest number of mixing weights. Embodiment 'A' should always provide the highest compression ratio since all information provided by the model is used to form the final prediction. In particular, embodiment 'A' can achieve a higher compression ratio than the compressor defined by Mattern in the reference above.

Figure 16:
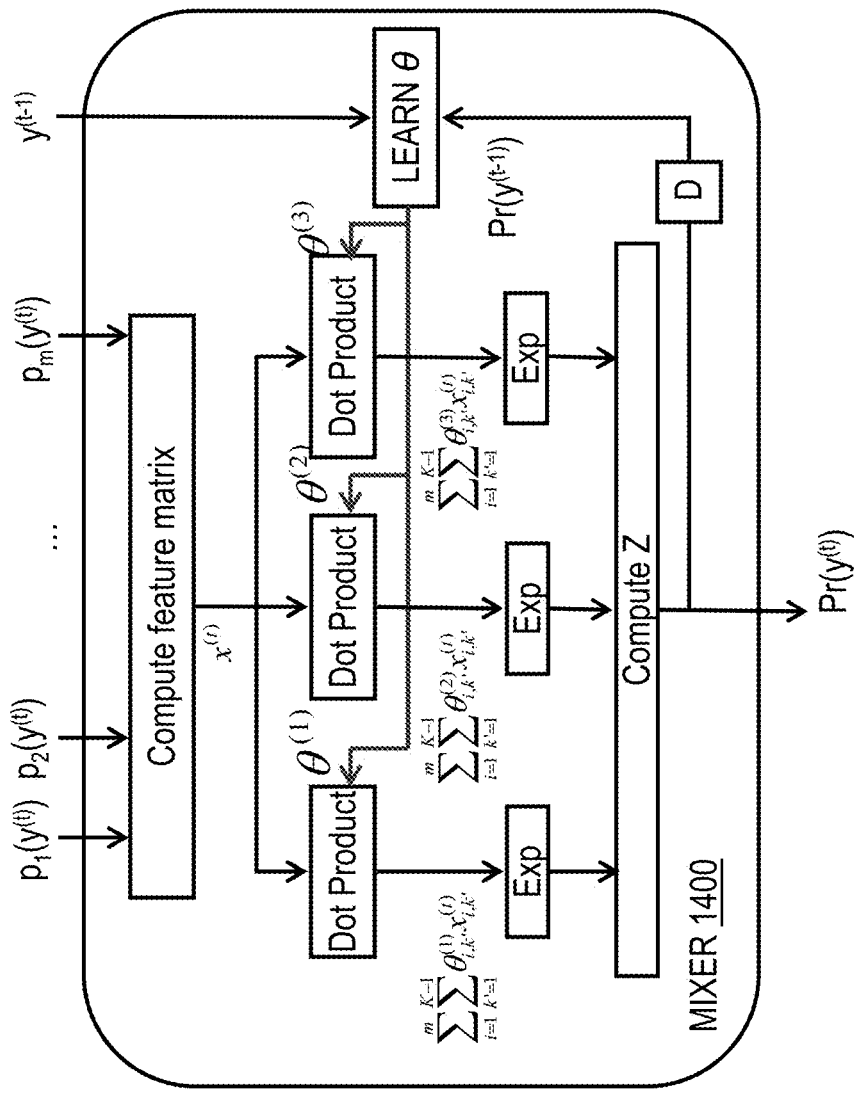
FIG. 16 depicts a block diagram of an exemplary mixer for embodiment 'A' of FIG. 15 with an alphabet having four input symbols (i.e., K=4)

With reference to FIG. 16, mixer 1400 is implemented as a maximum entropy mixer for embodiment 'A' with K=4. In total there are 3*3*m=9*m weights that must be learned as follows:

$$\theta^{(1)} = \begin{pmatrix} \theta^{(1)}_{1,1} & \theta^{(1)}_{1,2} & \theta^{(1)}_{1,3} \\ \theta^{(1)}_{2,1} & \theta^{(1)}_{2,2} & \theta^{(1)}_{2,3} \\ \vdots & \vdots & \vdots \\ \theta^{(1)}_{m,1} & \theta^{(1)}_{m,2} & \theta^{(1)}_{m,3} \end{pmatrix} \in \mathbb{R}^{m \times 3}$$

$$\theta^{(2)} = \begin{pmatrix} \theta^{(2)}_{1,1} & \theta^{(2)}_{1,2} & \theta^{(2)}_{1,3} \\ \theta^{(2)}_{2,1} & \theta^{(2)}_{2,2} & \theta^{(2)}_{2,3} \\ \vdots & \vdots & \vdots \\ \theta^{(2)}_{m,1} & \theta^{(2)}_{m,2} & \theta^{(2)}_{m,3} \end{pmatrix} \in \mathbb{R}^{m \times 3}$$

$$\theta^{(3)} = \begin{pmatrix} \theta^{(3)}_{1,1} & \theta^{(3)}_{1,2} & \theta^{(3)}_{1,3} \\ \theta^{(3)}_{2,1} & \theta^{(3)}_{2,2} & \theta^{(3)}_{2,3} \\ \vdots & \vdots & \vdots \\ \theta^{(3)}_{m,1} & \theta^{(3)}_{m,2} & \theta^{(3)}_{m,3} \end{pmatrix} \in \mathbb{R}^{m \times 3}$$

As is illustrated, mixer 1400 includes a compute feature matrix block that computes a feature matrix $x^{(t)}$, 'K−1' dot product blocks that calculate dot products of the feature matrix elements and associated weights, 'K−1' natural exponential function (Exp) blocks that calculate the e^(dot product) for dot product results, and a compute Z block that computes a normalizing constant and then produces learned predictions ($Pr(y^{(t)})$). During simulation with a dataset of 256×1 MB samples for K=2 (i.e., 1-bit symbols) a compression ratio (CR) of 8.04 was achieved with a throughput of 1.38 MB/s for a single core processor using conventional binary context mixing compression. A CR of 8.11 with a throughput of 2.11 MB/s was achieved during simulation for embodiment 'C' with K=4 (i.e., 2-bit symbols) for the dataset, which corresponds to about a fifty-three percent faster compression as compared to conventional binary context mixing compression (i.e., K=2) case. A CR of 8.21 with a throughput of 1.63 MB/s was achieved during simulation for embodiment 'A' with K=4 for the dataset, which corresponds to about a two percent higher CR as compared to conventional binary context mixing compression.

Figure 17:
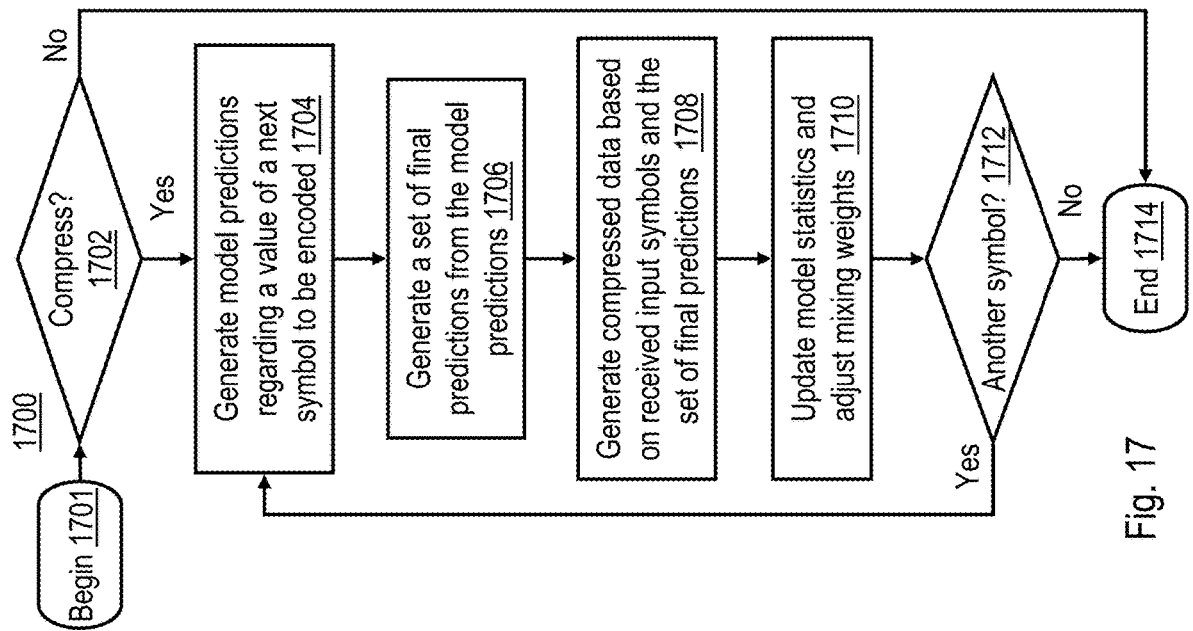
FIG. 17 is a high level logical flowchart of an exemplary compression process that implements non-binary context mixing in accordance with one embodiment of the present disclosure.

With reference to FIG. 17, an exemplary process 1700 is illustrated that performs compression for a data storage system on data pages in accordance with an embodiment of the present disclosure. In one or more embodiments, process 1700 is initiated, in block 1701, by compressor 1000 of flash controller 140 when a write IOP (e.g., a 4 kB data page with a number of symbols) is received. In another embodiment process 1700 may also be initiated by compressor 1000 of flash controller 140 in response to a background compression request. Next, in decision block 1702, flash controller 140 determines whether the IOP corresponds to a request to write a data page (i.e., a write IOP) to a flash card 126 or a background compression request. In response to the received IOP not corresponding to a write data page request or background compression request, control transfers from block 1702 to block 1714, where process 1700 terminates. In response to the received IOP corresponding to a write data page request or background compression request, control transfers to block 1704. In block 1704 compressor 1000 generates model predictions regarding a value of a next symbol of a data page to be encoded. Next, in block 1706, compressor 1000 generates a set of final predictions from the model predictions. Then, in block 1708, compressor 1000 generates compressed data based on received input symbols and the set of final predictions. Next, in block 1710, compressor 1000 updates model statistics and adjusts mixing weights. Then, in decision block 1712, compressor 1000 determines whether the data page includes another symbol that requires compression. In response to the data page including another symbol that requires compression control transfers from block 1712 to block 1704. In response to the data page not including another symbol that requires compression control transfers from block 1712 to block 1714, where process 1700 terminates.

Figure 18:
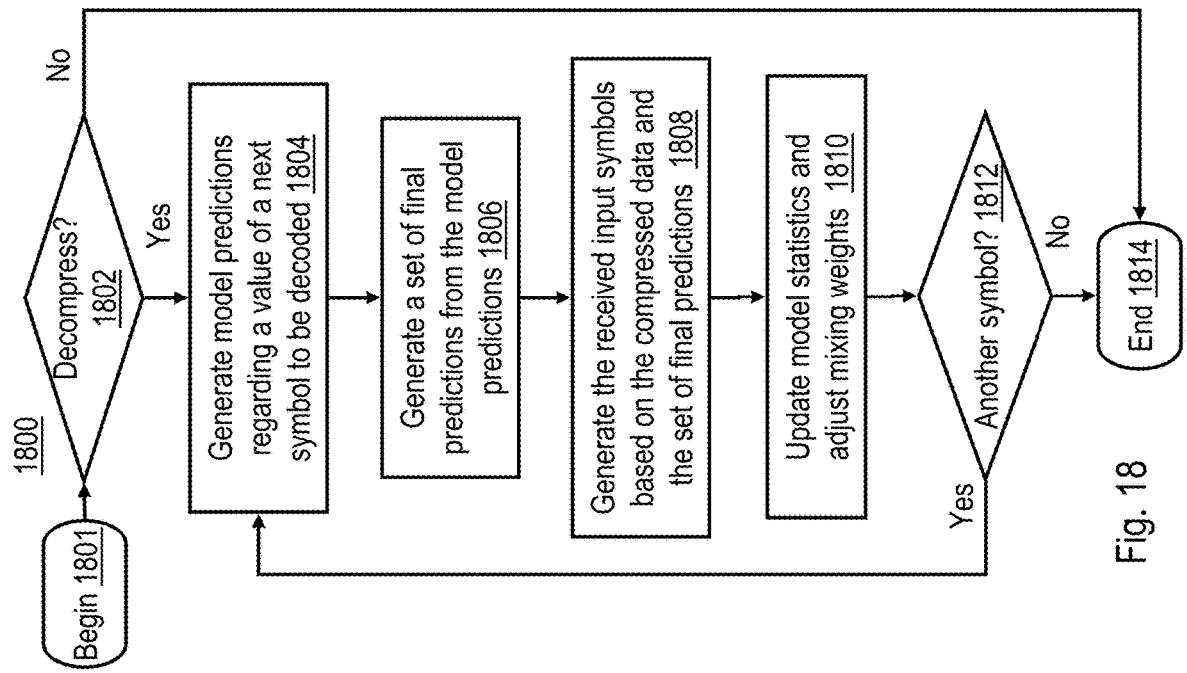
FIG. 18 is a high level logical flowchart of an exemplary decompression process that implements non-binary context mixing in accordance with one embodiment of the present disclosure.

With reference to FIG. 18, an exemplary process 1800 is illustrated that performs decompression for a data storage system on data pages in accordance with an embodiment of the present disclosure. In one or more embodiments, process 1800 is initiated in block 1801 by decompressor 1002 of flash controller 140 when a read IOP is received. In another embodiment process 1800 may also be initiated by decompressor 1002 of flash controller 140 in response to a background decompression request. Next, in decision block 1802, flash controller 140 determines whether the IOP corresponds to a request to read a data page (i.e., a read IOP) from a flash card 126 or a background decompression request. In response to the received IOP not corresponding to a read data page request or background decompression request, control transfers from block 1802 to block 1814, where process 1800 terminates. In response to the received IOP corresponding to a read data page request or background decompression request, control transfers to block 1804. In block 1804 decompressor 1002 generates model predictions regarding a value of a next symbol to be decoded for the data page. Next, in block 1806, decompressor 1002 generates a set of final predictions from the model predictions. Then, in block 1808, decompressor 1002 generates the received input symbols based on the compressed data and the set of final predictions. Next, in block 1810, decompressor 1002 updates model statistics and adjusts mixing weights. Then, in decision block 1812, decompressor 1002 determines whether another symbol in the data page requires decompression. In response to another symbol in the data page requiring decompression control transfers from block 1812 to block 1804. In response to another symbol in the data page not requiring decompression control transfers from block 1812 to block 1814, where process 1800 terminates.

In general, later PAQ versions (e.g., PAQ8 and later) mix predictions from over five-hundred different context models to achieve a relatively high compression ratio. Unfortunately, the PAQ8 algorithm has a very low speed due, at least in part, to the large number of context models utilized. In general, the ensemble of context models used in PAQ8 is designed to provide high compression for many different types of data and includes many specialized context models that are designed for a wide variety of data types, e.g., images, audio, text, etc.

To make a prediction about a data symbol $y^{(t)}$ each context model first calculates a P-bit context based on data symbols the context model has previously seen, i.e., symbols $y^{(1)}$, $y_{(2)}, \ldots, y^{(t-1)}$. Two exemplary context functions are as follows:

$$CXT_1(y^{(1)}, y^{(2)}, \ldots, y^{(t-1)}) = \text{hash}[y^{(t-4)}, y^{(t-3)}, y^{(t-2)}, y^{(t-1)}] \in [0, 2^P-1]$$

$$CXT_2(y^{(1)}, y^{(2)}, \ldots, y^{(t-1)}) = \text{hash}[y^{(t-7)}, y^{(t-5)}, y^{(t-3)}, y^{(t-1)}] \in [0, 2^P-1]$$

As is illustrated above, both $CXT_1$ and $CXT_2$ context functions perform hash functions on specific symbols.

In a typical implementation, the P-bit context (CXT) points to an address in memory where a set of 'K' counters, i.e., $N_1(CXT)$, $N_2(CXT)$, ..., $N_k(CXT)$, can be retrieved. $N_k(CXT)$ counts the number of times the kth symbol has been observed in the context. The predictions about data symbol $y^{(t)}$ may then be computed as follows:

$$Pr(y^{(t)} = k \mid CXT(y^{(1)}, y^{(2)}, \ldots, y^{(t-1)})) = \frac{N_k(CXT)}{\sum_{k'=1}^{K} N_{k'}(CXT)}$$

According to one or more aspects of the present disclosure, the fact that customer workloads usually consist of specific kinds of data (e.g., formatted database records) is taken into consideration to facilitate tailoring context model ensembles to speed-up compression/decompression. According to one embodiment of the present disclosure, an iterative technique for designing relatively small context model ensembles is implemented. The iterative technique reduces a large set of M context models to a subset of M' desired context models (where M'<M) while still maintaining a relatively high compression ratio (CR). The techniques for reducing a size of a context model ensemble may be implemented offline or can be run as a background process (e.g., in firmware) to adapt the ensemble of context models used in a context mixing compressor/decompressor to different and changing customer workloads.

As one example, an iterative process for context model selection for a compressor may begin with a set of 'N' unselected models and '0' selected models. The compressor is first run 'N' times, each time activating one of the possible models and determining which model produces the best compression ratio (CR). The context model that produces the best CR is then included in the context model ensemble or set. After running the compressor 'N' times there are a set of 'N-1' unselected context models and one selected context model. The compressor is then run for the 'N-1' remaining context models and a determination is made as to which context model (within the 'N-1' remaining context models), when added to the set of selected context models, produces the highest CR. The model is then added to the set. The process repeats until the desired number of models are located. The process can, for example, be carried out in a flash system as a background process adapting the selected context models for a customer workload. As one example, in a simulation using a dataset with 8×1 MB samples PAQ81 implemented 552 context models with a CR of 9.00 and 0.02 MB/s throughput. In contrast, implementing the disclosed context model reduction process described herein for the dataset with 8 context models resulted in a CR of 8.36 with a 2.11 MB/s throughput. It should be appreciated that reducing the context model ensemble size from 552 to 8 dramatically increased the throughput while only marginally reducing the CR.

Figure 19:
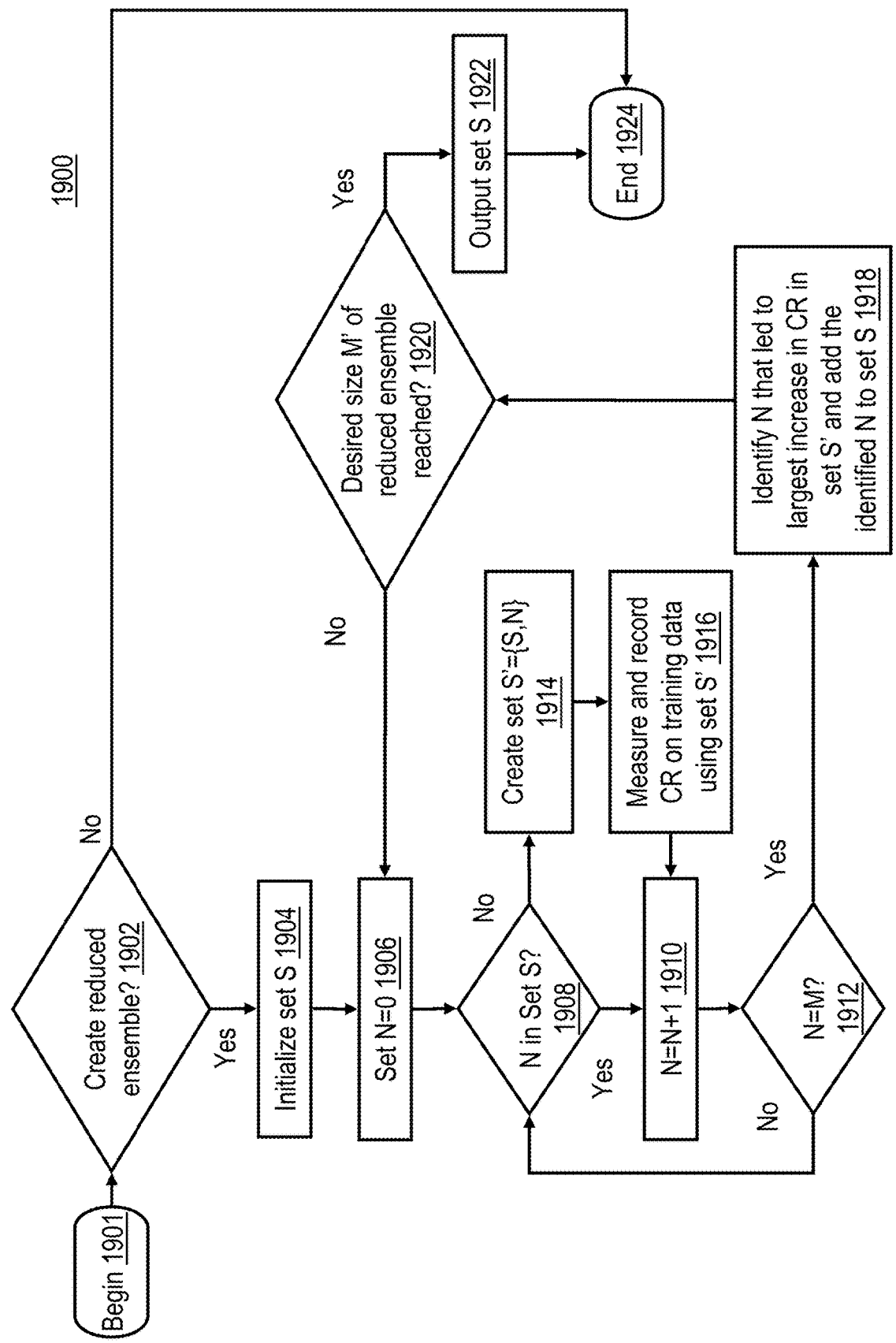
FIG. 19 is a high level logical flowchart of an exemplary process for selecting context models for non-binary context mixing in accordance with another embodiment of the present disclosure.

With reference to FIG. 19, an exemplary process 1900 is illustrated that determines a reduced context model ensemble that is to be used for data compression/decompression in a data storage system, based on a customer workload, in accordance with an embodiment of the present disclosure. Process 1900 may, for example, be implemented by flash controller 140. Process 1900 may be periodically initiated in block 1901 by flash controller 140 as a background process. Next, in decision block 1902, flash controller 140 determines whether a reduced context model is indicated, e.g., whether a new customer workload has been initiated. In response to a reduced context model not being indicated in block 1902 control transfers to block 1924, where process 1900 terminates. In response to a reduced context model being indicated in block 1902 control transfers to block 1904, where flash controller 140 initializes a set S (which represents an ensemble of context models).

Next, in block 1906, flash controller 140 sets the variable 'N' equal to zero. It should be appreciated that 'N' represents the current context model. As one example, for 'N' equal to zero 'context model 0' is indicated. As another example, for 'N' equal to one-hundred 'context model 100' is indicated. As yet another example, for 'N' equal to five-hundred 'context model 500' is indicated. Then, in decision block 1908, flash controller 140 determines whether context model N is already in set S. As set S was initialized in block 1904 set S is empty and control initially transfers from block 1908 to block 1914, where context model N (i.e., context model 0) is added to set S'. Next, in block 1916, flash controller 140 measures and records the compression ratio (CR) on training data (that is a representative sample of a customer workload) using set S'. Then, in block 1910, flash controller 140 increments 'N' by one (i.e., N=N+1).

Next, in decision block 1912, flash controller 140 determines whether 'N' is equal to 'M' (where 'M' corresponds to the total number of context models that are in a non-reduced context model ensemble). In response to 'N' not being equal to 'M' in block 1912 control returns to block 1908, where flash controller 140 determines whether context model 'N+1' is in set S. As process 1900 was recently initialized context model 'N+1' is not in the set S and control transfers from block 1908 to block 1914, to block 1916, to block 1910, and to block 1912. In response to 'N' eventually being equal to 'M' in block 1912 control transfers to block 1918. In block 1918 flash controller 140 identifies the 'N' (i.e., the context model N) that led to the largest increase in CR in set S' and adds the context model N that led to the largest increase in CR to the set S.

From block 1918 control transfers to decision block 1920. In block 1920 flash controller 140 determines whether a desired size of a reduced context model ensemble has been reached (i.e., whether enough context models have been added to set S). As one example, the desired size of the reduced context model ensemble may be determined based on achieving a desired minimum CR and throughput. In response to the desired size of the reduced context model ensemble not being reached in block 1920 control transfers to block 1906 for another iteration to add another context model to set S. In response to the desired size of the reduced context model ensemble being reached in block 1920 control transfers to block 1924, where process 1900 terminates.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As has been described, a controller of a non-volatile memory array retires physical pages within the non-volatile memory array on a page-by-page basis. The physical pages retired by the controller include a first physical page sharing a common set of memory cells with a second physical page. While the first physical page is retired, the controller retains the second physical page as an active physical page, writes dummy data to the first physical page, and writes data received from a host to the second physical page.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude transmission media per se, transitory propagating signals per se, and forms of energy per se.

In addition, although embodiments have been described that include use of a NAND flash memory, it should be appreciated that embodiments of the present invention can also be used with other types of non-volatile random access memory (NVRAM) including, for example, phase-change memory (PCM) and combinations thereof The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method of adding context models to a context model ensemble in a context mixing compressor of a data storage system, the method comprising:

for each context model among more than two different context models included in a base set of context models, measuring, by a controller, a respective individual compression ratio (CR) of a context mixing compressor obtained by utilizing said each context model alone on a common dataset;

based on the measuring of the respective individual CRs, adding to a context model ensemble, by the controller, a first context model within the base set of context models that has a maximum measured CR when utilized alone to compress the common dataset;

following addition of the first context model to the context model ensemble and based on a desired number of distinct context models not being in the context model ensemble, said desired number being at least two:

measuring, by the controller, a respective CR for the context mixing compressor on the common dataset for each of the context models in the base set of context models that is not in the context model ensemble as utilized in conjunction with one or more context models already added to the context model ensemble; and adding to the context model ensemble, by the controller, one or more additional context models, in the base set of context models, that, utilized in conjunction with the one or more context models already added to the context model ensemble, result in a maximum CR for the common dataset, wherein the adding the one or more additional context models is performed until the context model ensemble has increased to the desired number of distinct context models, and wherein limiting a size of the context model ensemble to the desired number of context models increases throughput while only marginally reducing the maximum subsequent CR that is achieved by the data storage system.

2. The method of claim 1, wherein the context mixing compressor is a non- binary context mixing compressor configured to compress datasets employing symbols belonging to an alphabet of size greater than two.

3. The method of claim 1, wherein the context mixing compressor is a binary context mixing compressor.

4. The method of claim 1, and further comprising determining the desired number of the context models based on achieving a desired minimum CR.

5. The method of claim 1, and further comprising determining the desired number of the context models based on achieving a desired minimum throughput.

6. The method of claim 1, and further comprising determining the desired number of the context models based on achieving a desired minimum CR and desired minimum throughput.

7. The method of claim 1, wherein the common dataset is associated with a customer workload.

8. A data storage system, comprising:
a flash memory system; and
a flash controller coupled to the flash memory system, wherein the flash controller includes a context mixing compressor and the flash controller is configured to perform:
for each context model among more than two different context models included in a base set of context models, measuring respective individual compression ratios (CR) of the context mixing compressor obtained by utilizing said each context model alone on a common dataset;
based on the measuring of the respective individual CRs, adding to a context model ensemble a first context model within the base set of context models that has a maximum measured CR when utilized alone to compress the common dataset;
following addition of the first context model to the context model ensemble and based on a desired number of distinct context models not being in the context model ensemble, measuring a respective CR for the context mixing compressor on the common dataset for each of the context models in the base set of context models that is not in the context model ensemble as utilized in conjunction with one or more context models already added to the context model ensemble; and
adding to the context model ensemble one or more additional context models, in the base set of context models, that utilized in conjunction with the one or more context models already added to the context model ensemble result in a maximum CR for the common dataset, wherein the adding the one or more additional context models is performed until the context model ensemble has increased to the desired number of distinct context models, and wherein limiting a size of the context model ensemble to the desired number of context models increases throughput while only marginally reducing the maximum subsequent CR that is achieved by the data storage system.

9. The data storage system of claim 8, wherein the context mixing compressor is a non-binary context mixing compressor configured to compress datasets employing symbols belonging to an alphabet of size greater than two.

10. The data storage system of claim 8, wherein the context mixing compressor is a binary context mixing compressor.

11. The data storage system of claim 8, wherein the desired number of the context models is determined based on achieving a desired minimum CR.

12. The data storage system of claim 8, wherein the desired number of the context models is determined based on achieving a desired minimum throughput.

13. The data storage system of claim 8, wherein the desired number of the context models is determined based on achieving a desired minimum CR and desired minimum throughput.

14. The data storage system of claim 8, wherein the dataset is associated with a customer workload.

15. A computer program product, the computer program product comprising a computer readable storage medium having program instructions embodied therewith, the program instructions executable by a controller of a data storage system, to cause the controller to perform:
for each context model among more than two different context models included in a base set of context models, measuring respective individual compression ratios (CR) of the context mixing compressor obtained by utilizing said each context model alone on a common dataset;
based on the measuring of the respective individual CRs, adding to a context model ensemble a first context model within the base set of context models that has a maximum measured CR when utilized alone to compress the common dataset;
following addition of the first context model to the context model ensemble and based on a desired number of distinct context models not being in the context model ensemble, measuring a respective CR for the context mixing compressor on the common dataset for each of the context models in the base set of context models that is not in the context model ensemble as utilized in conjunction with one or more context models already added to the context model ensemble; and
adding to the context model ensemble one or more additional context models, in the base set of context models, that utilized in conjunction with the one or more context models already added to the context model ensemble result in a maximum CR for the common dataset, wherein the adding the one or more additional context models is performed until the context model ensemble has increased to the desired number of distinct context models, and wherein limiting a size of the context model ensemble to the desired number of context models increases throughput while only marginally reducing the maximum subsequent CR that is achieved by the data storage system.

16. The program product of claim 15, wherein the context mixing compressor is a non-binary context mixing compressor configured to compress datasets employing symbols belonging to an alphabet of size greater than two.

17. The program product of claim 15, wherein the context mixing compressor is a binary context mixing compressor.

18. The program product of claim 15, wherein the desired number of the context models is determined based on achieving a desired minimum CR.

19. The program product of claim 15, wherein the desired number of the context models is determined based on achieving a desired minimum throughput.

20. The program product of claim 15, wherein the desired number of the context models is determined based on achieving a desired minimum CR and desired minimum throughput.

\* \* \* \* \*